United States Patent
Hashimoto et al.

(10) Patent No.: US 11,590,603 B2
(45) Date of Patent: Feb. 28, 2023

(54) ROLL-BONDED BODY AND METHOD FOR PRODUCING SAME

(71) Applicant: TOYO KOHAN CO., LTD., Tokyo (JP)

(72) Inventors: Yusuke Hashimoto, Kudamatsu (JP);
Teppei Kurokawa, Kudamatsu (JP);
Takashi Koshiro, Kudamatsu (JP);
Kota Sadaki, Kudamatsu (JP)

(73) Assignee: TOYO KOHAN CO., LTD., Tokyo (JP)

( * ) Notice: Subject to any disclaimer, the term of this patent is extended or adjusted under 35 U.S.C. 154(b) by 366 days.

(21) Appl. No.: 16/621,414

(22) PCT Filed: May 14, 2018

(86) PCT No.: PCT/JP2018/018591
§ 371 (c)(1),
(2) Date: Dec. 11, 2019

(87) PCT Pub. No.: WO2018/230226
PCT Pub. Date: Dec. 20, 2018

(65) Prior Publication Data
US 2020/0101558 A1    Apr. 2, 2020

(30) Foreign Application Priority Data

Jun. 13, 2017  (JP) .............................. JP2017-116161
Dec. 22, 2017  (JP) .............................. JP2017-246516

(51) Int. Cl.
*B23K 20/04*  (2006.01)
*B32B 15/01*  (2006.01)
*B21B 1/22*   (2006.01)

(52) U.S. Cl.
CPC ............... *B23K 20/04* (2013.01); *B21B 1/22* (2013.01); *B32B 15/013* (2013.01); *B32B 15/017* (2013.01); *B21B 2001/221* (2013.01)

(58) Field of Classification Search
None
See application file for complete search history.

(56) References Cited

U.S. PATENT DOCUMENTS 4,612,259 A * 9/1986 Ueda .................... B32B 15/013
                                              228/190
7,776,454 B2 * 8/2010 Chang ................ B23K 35/0238
                                              428/688

(Continued)

FOREIGN PATENT DOCUMENTS

JP        61266103 A    11/1986
JP       11-226753 A     8/1999

(Continued)

*Primary Examiner* — Devang R Patel
(74) *Attorney, Agent, or Firm* — Browdy and Neimark, P.L.L.C.

(57) ABSTRACT

[Problem] To provide: a roll-bonded body which is able to be suppressed in waviness in the surface; and a method for producing this roll-bonded body. [Solution] A roll-bonded body according to the present invention is obtained by bonding a first metal layer and a second metal layer with each other by means of rolling, and is characterized in that the surface of the first metal layer has an arithmetic average waviness ($Wa_1$) 0.01-0.96 and a maximum waviness height ($Wz_1$) of 0.2-5.0 μm.

13 Claims, 20 Drawing Sheets

<<Example 3>>

<<Example 4>>

(56) References Cited

U.S. PATENT DOCUMENTS

| | | | |
|---|---|---|---|
| 2008/0261059 A1* | 10/2008 | Kashima | B32B 15/01 428/457 |
| 2013/0048154 A1* | 2/2013 | Prevond | C23C 8/80 148/531 |
| 2014/0339288 A1 | 11/2014 | Otaki | |
| 2020/0173003 A1* | 6/2020 | Van Veldhuizen | C23C 2/02 |

FOREIGN PATENT DOCUMENTS

| | | |
|---|---|---|
| JP | 2001-1006 A | 1/2001 |
| JP | 3092598 U | 12/2002 |
| JP | 2004306098 A | 11/2004 |
| JP | 4684099 B2 | 5/2011 |
| JP | 2016-074198 A | 5/2016 |
| WO | 2017/057665 A1 | 4/2017 |

* cited by examiner

<<Example 1>>

<<Example 2>>

<<Example 3>>

<<Example 4>>

<<Example 5>>

<<Example 6>>

<<Example 7>>

<<Example 8>>

ROLL-BONDED BODY AND METHOD FOR PRODUCING SAME

TECHNICAL FIELD

The present invention relates to a roll-bonded body, and more specifically to a roll-bonded body obtained by bonding two metal plates to each other by rolling and a method of producing the roll-bonded body.

BACKGROUND ART

Metallic materials represented by various steel materials are preferably used as press-formed parts for mobile electronic apparatuses such as smart phones. As such a metallic material, there are known, in addition to metallic materials including a single kind of metal, roll-bonded bodies (appropriately referred to also as metal laminates or clad materials) in which two or more kinds of metal plates or metal foils (whether they are plates or foils is according to the difference in thickness and, therefore, these will be hereinafter collectively treated as "plates") are laminated by rolling.

In a case where these metallic materials are used for mobile electronic apparatuses, excellent external appearance property and brilliance property are demanded.

For example, PTL 1 discloses a ceramic which has a mirror surface having periodic waviness at a predetermined pitch, for obtaining an electronic apparatus case having scratch resistance and serving as a glossy surface and for decorativeness.

On the other hand, in a case where the press-formed part for mobile electronic apparatuses is used for an outermost housing or the like, the ceramic disclosed in PTL 1 is poor in heat radiation property or brilliance property and cannot obtain metallic luster.

On the other hand, for example, PTL 2 discloses a metal laminate which is excellent in heat radiation property and has good formability and the like.

CITATION LIST

[Patent Literature]
[PTL 1]
  Japanese Patent No. 4684099
[PTL 2]
  PCT Patent Publication No. WO2017/057665

SUMMARY

[Technical Problems]

In general, a roll-bonded body obtained by bonding a plurality of metal plates to each other by rolling is produced through the following steps. First, the metal plates are bonded by use of a production apparatus like the one described, for example, in Japanese Patent Laid-open No. Hei 1-224184 to produce a roll-bonded body.

Next, for enhancing the adhesion at bonding surfaces of the roll-bonded body, a heat treatment is conducted by a method like the one disclosed in, for example, paragraphs [0049] to [0051] of PCT Patent Publication No. WO2017/057665.

Subsequently, for removing warpage or the like of the roll-bonded body generated in the steps ranging to the heat treatment, the roll-bonded body is passed through one or a plurality of correction rolls while applying a tension to the roll-bonded body. In other words, the roll-bonded body is passed through a tension leveler. Note that this step is referred to also as "shape correction."

Through the step of shape correction, large waviness disappears from the roll-bonded body.

Thereafter, in the after-steps after the shape correction until shipping, the roll-bonded body undergoes a "plate passing step" in which the roll-bonded body is moved along a roll or rolls according to the need for re-winding or the like, and waving (hereinafter referred to also as "waviness") smaller than the above-mentioned warpage would be thereby generated in the surface of the roll-bonded body.

The cause of generation of such "waviness" in the surface of the roll-bonded body has not yet fully elucidated, but it is inferred that the waviness is generated due to the following factor.

In the above-mentioned plate passing step, if the tension given in a moving direction and a reverse direction of the roll-bonded body is insufficient, the roll-bonded body may not move perfectly along the roll but may repeat contact with and separation from the roll when the roll-bonded body is passed through the roll. As a result, a mark (referred to also as "knock pattern") generated upon contact with the roll is left in the surface of the roll-bonded body, and this is considered to cause the waviness.

In addition, it is also considered that in the case of using a plurality of rolls in the plate passing step, if a pitch between the rolls is too long, the roll-bonded body does not move perfectly along the rolls, resulting in that the "knock pattern" is generated in the surface of the roll-bonded body.

Recently, housings of mobile electronic apparatuses have been demanded to have excellent external appearance performance. When the roll-bonded body is press-formed into a housing of a mobile electronic apparatus, if the above-mentioned "waviness" is present in the surface of the roll-bonded body, it is difficult to finish the external appearance of the housing into an excellent mirror surface. In other words, it is difficult to obtain an external appearance which is excellent in image clarity.

Besides, even if the "waviness" is generated in the surface of the roll-bonded body, the "waviness" may possibly be reduced by grinding or polishing the surface at a final stage of production. However, an increase in polishing amount would cause such demerits as a lowering in productivity and a rise in cost. In such a situation, it is assumed that it will be demanded in the future to solve, easily and instantaneously, the problem of the "waviness" generated in the surface of the roll-bonded body.

On the other hand, hitherto, the problem as to the "waviness" of the roll-bonded body has not been discussed.

The present inventors paid attention to these problems and, for contributing to the production of a formed product which is better in external appearance performance and has excellent mirror surface (image clarity), they have made the present invention.

The present invention has been made in consideration of solving, for example, the above-mentioned problems. It is an object of the present invention to provide a roll-bonded body capable of suppressing "waviness" in the surface, in producing a roll-bonded body in which a plurality of metal plates are bonded by rolling, and a method of producing the roll-bonded body.

[Solution to Problems]

In order to solve the above-mentioned problems, a roll-bonded body according to the present invention is (1) a roll-bonded body obtained by bonding a first metal layer and a second metal layer to each other by rolling, in which a surface of the first metal layer has an arithmetic average waviness ($Wa_1$) of 0.01 to 0.96 μm and a maximum waviness height ($Wz_1$) of 0.2 to 5.0 μm.

Alternatively, in order to solve the above-mentioned problems, another roll-bonded body according to the present invention is (2) a roll-bonded body obtained by bonding a first metal layer and a second metal layer to each other by rolling, in which a surface of the first metal layer has an arithmetic average waviness ($Wa_1$) of 0.01 to 0.96 μm and a maximum waviness height ($Wz_1$) of 0.2 to 5.0 μm when the surface is mirror polished to an arithmetic average roughness ($Ra_1$) of 1 to 30 nm.

Note that in the roll-bonded body as described in the above paragraph (1) or (2), preferably, (3) a surface of the second metal layer has an arithmetic average waviness ($Wa_2$) of 0.01 to 1.0 μm and a maximum waviness height ($Wz_2$) of 0.2 to 6.0 μm.

In addition, in the roll-bonded body as described in any one of the above paragraphs (1) to (3), preferably, (4) the arithmetic average waviness ($Wa_1$) of the surface of the first metal layer is smaller than the arithmetic average waviness ($Wa_2$) of the surface of the second metal layer.

Besides, in the roll-bonded body as described in any one of the above paragraphs (1) to (4), preferably, (5) the maximum waviness height ($Wz_1$) of the surface of the first metal layer is smaller than the maximum waviness height ($Wz_2$) of the surface of the second metal layer.

In addition, in the roll-bonded body as described in any one of the above paragraphs (1) to (5), preferably, (6) an intermediate metal layer is formed between the first metal layer and the second metal layer.

Besides, in the roll-bonded body as described in any one of the above paragraphs (1) to (6), preferably, (7) the first metal layer is used on an outer surface side of an electronic apparatus housing, and the second metal layer is used on an inner surface side of the electronic apparatus housing.

In addition, in the roll-bonded body as described in any one of the above paragraphs (1) to (7), preferably, (8) the first metal layer and the second metal layer each include Fe, Ti, Ni, Al, Mg, Cu, or an alloy based on any one of these metals.

Besides, in the roll-bonded body as described in any one of the above paragraphs (1) to (8), preferably, (9) the first metal layer includes SUS, or Ti, Ni, or an alloy based on any one of these metals.

In addition, in the roll-bonded body as described in any one of the above paragraphs (6) to (9), preferably, (10) the intermediate metal layer includes Fe, Ti, Ni, Al, Mg, Cu, or an alloy based on any one of these metals.

Further, in order to solve the above-mentioned problems, an electronic apparatus housing according to the present invention (11) includes the roll-bonded body as described in any one of the above paragraphs (1) to (10), in which the first metal layer is on an outer surface side, and the second metal layer is on an inner surface side.

In this instance, in the electronic apparatus housing as described in the above paragraph (11), preferably, (12) an outer surface side surface has an arithmetic average roughness (Ra) of equal to or less than 30 nm.

Further, in order to solve the above-mentioned problems, a method of producing a roll-bonded body according to the present invention is (13) a method of producing a roll-bonded body by bonding a first metal layer and a second metal layer to each other by rolling, the method including: a step of correcting a shape of the roll-bonded body, and a plate passing step after the shape correction, in which in the plate passing step, by setting an outside diameter of at least a roll on a finishing end side of the step to equal to or more than 200 mm, a roll-bonded body in which a surface of the first metal layer has an arithmetic average waviness ($Wa_1$) of 0.01 to 0.96 μm and a maximum waviness height ($Wz_1$) of 0.2 to 5.0 μm is obtained.

In addition, in order to solve the above-mentioned problems, another method of producing a roll-bonded body according to the present invention is (14) a method of producing a roll-bonded body by bonding a first metal layer and a second metal layer to each other by rolling, the method including: a step of correcting a shape of the roll-bonded body, and a plate passing step after the shape correction, in which in the plate passing step, a surface of the second metal layer of the roll-bonded body is first put into contact with a roll, to thereby obtain a roll-bonded body in which a surface of the first metal layer has an arithmetic average waviness ($Wa_1$) of 0.01 to 0.96 μm and a maximum waviness height ($Wz_1$) of 0.2 to 5.0 μm.

[Advantageous Effects of Invention]

According to the roll-bonded body and the method of producing the same of the present invention, it is possible to provide a roll-bonded body which not only has processability and heat radiation property but also is suppressed in "waviness" in the surface thereof. The roll-bonded body of the present invention, by utilizing its excellent characteristic properties, can be preferably used, for example, as a housing of a mobile electronic apparatus which has beautiful metallic luster and image clarity.

BRIEF DESCRIPTION OF DRAWINGS (FIG. 1*a*) is a schematic diagram depicting an external appearance in a case where a roll-bonded body 1 in the present embodiment has a two-layer configuration, and (FIG. 1*b*) is a schematic diagram depicting an external appearance in a case where the roll-bonded body 1 in the present embodiment has a three-layer configuration.

DESCRIPTION OF EMBODIMENTS

Figure 1A:
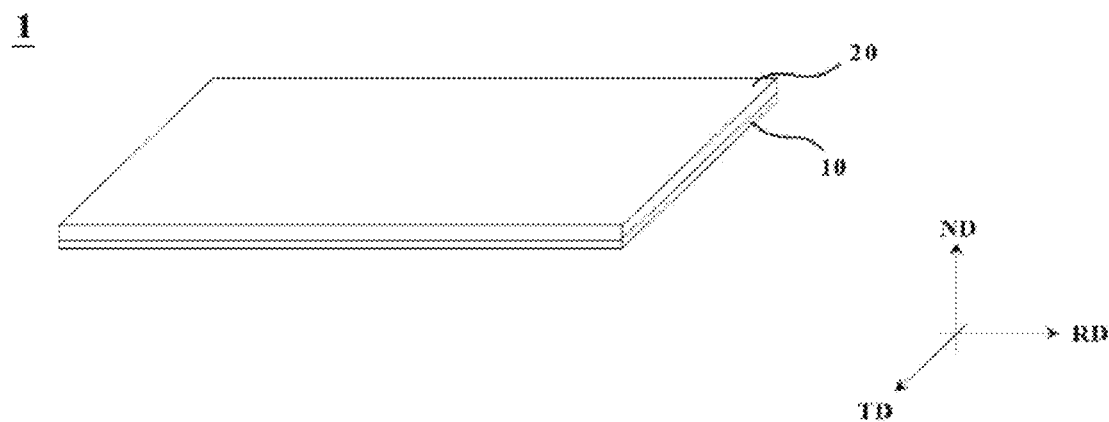

As one example of carrying out the present invention, an embodiment will be described below referring to the drawings. Note that in FIGS. 1 to 4, "RD" denotes a rolling direction, "TD" denotes a rolling perpendicular direction, and "ND" denotes a rolling plane normal direction.

<Roll-Bonded Body>

A roll-bonded body in the present embodiment is characterized by being suppressed in "waviness" in a surface thereof. Here, the "waviness" in the present invention is defined as a concept including an arithmetic average waviness (Wa) and a maximum waviness height (Wz) determined according to JIS B 0601:2001.

As illustrated in FIG. 1(a), a roll-bonded body 1 in the present embodiment is obtained by bonding at least a first metal layer 10 and a second metal layer 20 to each other by rolling. The roll-bonded body 1 is characterized in that a surface (a surface on a side opposite to a bonding interface) of the first metal layer 10 has an arithmetic average waviness ($Wa_1$) of 0.01 to 0.96 μm and a maximum waviness height ($Wz_1$) of 0.2 to 5.0 μm.

In addition, while an example in which two metal layers (the first metal layer and the second metal layer) are bonded to each other by rolling is described as the roll-bonded body 1 in the present embodiment, the present embodiment is not limited to this mode, and three or more metal layers may be bonded by rolling. In other words, the roll-bonded body may be, for example, a three-layer roll-bonded body in which a first metal layer, a second metal layer, and a third metal layer are bonded to one another. Besides, in that case, the first metal layer and the third metal layer may be metal plates of different kinds, or the first metal layer and the third metal layer may be metal plates of a same kind.

Besides, a known protective layer may be provided, as required, on an outermost surface (a surface on a side opposite to an interface of the roll-bonded body 1) of the roll-bonded body 1, in such a range as not to spoil a heat radiation property or an external appearance property, for the purpose of corrosion resistance, oxidation prevention, discoloration prevention or the like. As the protective layer, any of known various surface treatment films such as a chemical conversion treatment film and a chromate film may be applied according to the purpose. In this case, the protective film may be provided only on the surface on the first metal layer 10 side, the protective layer may be provided only on the surface on the second metal layer 20 side, or the protective layers may be provided on both surfaces.

In realizing the above-mentioned surface properties, a draft of the roll-bonded body 1 in the present embodiment is preferably 40% or less, more preferably 25% or less, and further preferably 15% or less.

A thickness of the roll-bonded body 1 is not particularly limited, and may be, for example, 0.06 to 3.0 mm. An upper limit for the thickness of the roll-bonded body 1 is more preferably 2.2 mm or less, and further preferably 1.5 mm or less. On the other hand, a lower limit for the thickness of the roll-bonded body 1, in a case where the roll-bonded body 1 is used as a housing of an electronic apparatus, is preferably 0.3 mm or more, and is more preferably 0.4 mm or more.

Note that "the thickness of the roll-bonded body" in the present embodiment refers to an average of measurements obtained by measuring the thickness at arbitrary 30 points on the roll-bonded body 1 by a micrometer or the like.

<First Metal Layer>

Preferred examples of the metal plate constituting the first metal layer 10 include Fe, Ti, Ni, Al, Mg, Cu and alloys based on any one of these metals. Of these materials, preferred examples include stainless steel (SUS) or Ti, Ni and alloys based on any one of these metals.

In a case where the first metal layer 10 is stainless steel, preferred examples thereof include SUS304, 304L, 316, 316L, 430, and 210. In the present embodiment, austenitic stainless steels are particularly preferred because of being nonmagnetic and the like, and more preferred examples as the first metal layer 10 include SUS304, 304L, 316, and 316L. In addition, from the viewpoint of drawability, the first metal layer 10 is preferably an annealed material (BA material) or a 1/2H material.

In a case where the first metal layer 10 is titanium (Ti), not only pure Ti but also Ti—Al alloys and Ti—Ni alloys can be used preferably, but these are not limitative.

Besides, in a case where the first metal layer 10 is aluminum (Al), a pure aluminum plate or aluminum alloy plates can be used preferably. As for the aluminum alloy plates, aluminum alloy plate materials containing more than 1% by weight of at least one additive metallic element selected from among Mg, Mn, Si, Zn, and Cu as other metallic element than aluminum are preferably used, but these are not limitative.

In addition, the thickness of the first metal layer 10 is not particularly limited and, for example, a thickness of approximately 0.01 to 0.6 mm is preferable. A lower limit for the thickness of the first metal layer 10 is preferably 0.045 mm or more, more preferably 0.05 mm or more, from the viewpoint of securing the thickness of the first metal layer 10 after carrying out final mirror polishing. On the other hand, an upper limit for the thickness of the first metal layer 10 is preferably 0.5 mm or less, more preferably 0.4 mm or less, from the viewpoint of a reduction in weight and heat radiation property.

Here, the "mirror polishing" in the present embodiment and Examples to be described later refers to a surface treatment in which the surface as a target of polishing is polished by a known technique represented by, for example, buff polishing, until the arithmetic average roughness ($Ra_1$) becomes 1 to 30 nm.

Note that "the thickness of the first metal layer 10" refers to an average of measurements obtained by acquiring an optical microscope photograph of a section of the roll-bonded body 1 and measuring the thickness of the first metal layer 10 at arbitrary ten points in the optical microscope photograph.

Besides, the first metal layer 10 in the present embodiment preferably has an arithmetic average waviness ($Wa_1$) in the surface (external appearance surface) thereof of 0.01 to 0.96 μm. The arithmetic average waviness ($Wa_1$) is more preferably 0.6 μm or less, further preferably 0.55 μm or less, and particularly preferably 0.25 μm or less. The arithmetic average waviness ($Wa_1$) of the first metal layer 10 is calculated based on the standard of JIS B 0601:2001. Specifically, the arithmetic average waviness ($Wa_1$) is an arithmetic average of a waviness curve obtained by removing microstructures (high frequency components) from a profile curve of reference length at an arbitrary position in the TD direction in the first metal layer 10.

Further, the first metal layer 10 in the present embodiment preferably has a maximum waviness height ($Wz_1$) of the surface (external appearance surface) thereof of 0.2 to 5.0

μm. The maximum waviness height ($Wz_1$) is more preferably 3.5 μm or less, further preferably 2.8 μm or less, and particularly preferably 1.0 μm or less. The maximum waviness height ($Wz_1$) of the first metal layer 10 is calculated based on the standard of JIS B 0601:2001. Specifically, the maximum waviness height ($Wz_1$) is a sum of a height of a ridge and a depth of a valley in a waviness curve obtained by removing microstructures (high frequency components) from a profile curve when a reference length is taken in the RD direction at an arbitrary position in the TD direction in the first metal layer 10.

In the present embodiment, with the arithmetic average waviness ($Wa_1$) and the maximum waviness height ($Wz_1$) of the first metal layer 10 prescribed as above-mentioned, the following effects are obtained.

The roll-bonded body 1 in the present embodiment is applicable to a press-formed part, a housing, and the like for mobile electronic apparatuses such as smart phones. In this case, an excellent external appearance property is obtained when the first metal layer 10 is on the outer surface side of a housing and, particularly, excellent image clarity can be obtained when the outer surface of the housing is mirror polished.

In a case where the arithmetic average waviness ($Wa_1$) of the first metal layer 10 exceeds 0.96 μm, image clarity after mirror polishing is lowered, which is undesirable.

On the other hand, in a case where the arithmetic average waviness ($Wa_1$) of the first metal layer 10 is less than 0.01 μm, image clarity is favorable.

In addition, the arithmetic average waviness ($Wa_1$) of the first metal layer 10 as an original plate before production of the roll-bonded body 1 is approximately 0.04 μm, and it is technically or economically difficult to cause the arithmetic average waviness ($Wa_1$) to be less than 0.01 μm after the production of the roll-bonded body 1. In view of this, in the present embodiment, the arithmetic average waviness ($Wa_1$) of the first metal layer 10 is prescribed to be 0.01 to 0.96 μm.

Further, the maximum waviness height ($Wz_1$) in the surface (external appearance surface) of the first metal layer 10 in the present embodiment is 0.2 to 5.0 μm, for the following reasons. In a case where the maximum waviness height ($Wz_1$) is less than 0.2 μm, it is technically or economically difficult to realize this, from the relation with the waviness possessed by the original plate before production of the roll-bonded body 1.

On the other hand, if the maximum waviness height ($Wz_1$) exceeds 5.0 μm, image clarity is lowered when the surface (external appearance surface) of the first metal layer 10 is mirror polished, which is undesirable.

The roll-bonded body of the present embodiment can have its surface mirror polished, after pressed into a housing of a mobile electronic apparatus or the like. Naturally, it is preferable that the housing or the like mirror polished has little waviness in the surface thereof.

In view of this, in the present embodiment, in a state of the roll-bonded body (a state before pressing into a housing or the like), mirror polishing was conducted on a trial basis. Then, by prescribing the waviness in the surface of the first metal layer 10 of the roll-bonded body after mirror polishing, a preferable state of waviness in the surface after pressing into the housing or the like and mirror polishing is produced on a simulative basis.

Specifically, in the present embodiment, in a case where the surface of the first metal layer is mirror polished to an arithmetic average roughness ($Ra_1$) of 1 to 30 nm, it is preferable that the arithmetic average waviness ($Wa_1$) is 0.01 to 0.96 μm, and the maximum waviness height ($Wz_1$) is 0.2 to 5.0 μm. Note that the arithmetic average roughness (Ra) is determined according to JIS B 0601:2001.

In a case where mirror polishing is conducted in the state of roll-bonded body on a simulative basis, by setting the waviness in the surface of the first metal layer to within the above-mentioned numerical value range, favorable image clarity can be obtained.

Here, the surface roughness (arithmetic surface roughness Ra) upon mirror polishing on the first metal layer 10 side of the roll-bonded body is 1 to 30 nm, for the following reason. Specifically, taking into account the surface roughness (arithmetic surface roughness Ra) upon mirror polishing conducted after pressing into the housing or the like, values with which a favorable mirror external appearance can be obtained are prescribed on a condition basis.

Note that as the method for mirror polishing mentioned above, there may be used any method of mechanical polishing such as buff polishing, electrolytic polishing, chemical polishing, and compound polishing involving a combination of these polishing techniques.

<Second Metal Layer>

The second metal layer 20 bonded to the first metal layer 10 by rolling may be configured using a metallic material of a different kind from the first metal layer 10, or may be configured using a metallic material of the same kind as the first metal layer 10. In the case where the second metal layer 20 is a metallic material of a different kind from the first metal layer 10 in the present embodiment, for example, a metal higher in thermal conductivity than the first metal layer 10 (or lower in specific gravity than the first metal layer 10) is used to configure the second metal layer 20, and it is thereby ensured that in a case where the roll-bonded body 1 of the present embodiment is applied to a housing of a mobile electronic apparatus such as a smart phone, a (lightweight) housing with a good heat radiation property can be realized.

Examples of a metal plate constituting the second metal layer 20 in the present embodiment include Fe, and Ti, Ni, Al, Mg, Cu and alloys based on either these or Fe. Among these materials, an aluminum plate or an aluminum alloy plate is preferable as the second metal layer 20, from the viewpoint of being lightweight and nonmagnetic.

Note that the metal mentioned as an example of the metal plate constituting the first metal layer 10 and the metal mentioned as an example of the metal plate constituting the second metal layer 20 can be replaced by each other in forming the roll-bonded body (for example, the first metal layer 10 may be aluminum and the second metal layer 20 may be stainless steel to form a roll-bonded body), insofar as the metals are materials capable of satisfying the surface properties of the first metal layer 10 and are materials capable of satisfying the external appearance properties required when formed into a housing of a mobile electronic apparatus.

As the aluminum alloy plate among the above-mentioned materials, it is preferable to use a plate material of an aluminum alloy containing more than 1% by weight of at least one additive metallic element selected from among Mg, Mn, Si, Zn and Cu as other metallic element than aluminum.

As such an aluminum alloy, there can be used, for example, Al—Cu alloys (2000 series), Al—Mn alloys (3000 series), Al—Si alloys (4000 series), Al—Mg alloys (5000 series), Al—Mg—Si alloys (6000 series), and Al—Zn—Mg alloys (7000 series) prescribed in JIS. Among these, aluminum alloys of the 3000 series, 5000 series, 6000 series, and 7000 series are preferred from the viewpoints of pressformability, strength, and corrosion resistance. Further, taking cost into account, aluminum alloys of the 5000 series are more preferable; in this case, the alloys may contain 0.3% by weight or more of Mg.

The second metal layer 20 of the present embodiment preferably has an arithmetic average waviness ($Wa_2$) in its surface (surface on the side opposite to the bonding interface) of 0.01 to 1.0 μm. Further, the second metal layer 20 of the present embodiment preferably has a maximum waviness height ($Wz_2$) in its surface of 0.2 to 6.0 μm. Note that the arithmetic average waviness ($Wa_2$) and the maximum waviness height ($Wz_2$) are calculated based on the standard of JIS B 0601:2001, like in the case of the first metal layer 10.

The reason why the arithmetic average waviness ($Wa_2$) and the maximum waviness height ($Wz_2$) of the second metal layer 20 are prescribed as above-mentioned in the present embodiment is as follows.

In a case where the roll-bonded body 1 in the present embodiment is applied to a housing of a mobile electronic apparatus or the like and the second metal layer 20 is an inner surface of the housing, the arithmetic average waviness ($Wa_2$) and the maximum waviness height ($Wz_2$) do not relate directly with the external appearance surface. However, in a recent situation in which a lightening of the housing of the mobile electronic apparatus is demanded, the thickness of the roll-bonded body has been becoming small. In a case where the roll-bonded body is thin and it is press-formed into a housing, the waviness of the second metal layer 20 on the inner surface side may influence the waviness of the surface of the first metal layer 10 constituting the external appearance surface. Besides, in the production step of the roll-bonded body 1, at the time of the plate passing step of passing along a roll surface, the waviness of the second metal layer 20 may influence the waviness of the first metal layer 10.

For such a reason, in the present embodiment, the arithmetic average waviness ($Wa_2$) and the maximum waviness height ($Wz_2$) of the second metal layer 20 are preferably prescribed as above-mentioned.

The arithmetic average waviness ($Wa_2$) and the maximum waviness height ($Wz_2$) of the second metal layer 20 are set to the above-mentioned ranges, since the arithmetic average waviness ($Wa_2$) and the maximum waviness ($Wz_2$) of the second metal layer 20 as an original plate before production of the roll-bonded body 1 are on the order of the above-mentioned prescriptions, and it is difficult to set them to or below the above-mentioned prescriptions upon forming the roll-bonded body 1.

On the other hand, in a case where the arithmetic average waviness ($Wa_2$) and the maximum waviness height ($Wz_2$) of the second metal layer 20 exceed the above-mentioned ranges, the second metal layer 20, when used on the inner surface side of the formed product, would influence the image clarity of the external appearance surface, which is undesirable.

Note that the arithmetic average waviness ($Wa_1$) in the surface of the first metal layer 10 is preferably smaller than the arithmetic average waviness ($Wa_2$) in the surface of the second metal layer 20.

Similarly, the maximum waviness height ($Wz_2$) in the surface of the first metal layer 10 is preferably smaller than the maximum waviness height ($Wz_2$) in the surface of the second metal layer 20.

The thickness of the second metal layer 20 will be described below.

It is preferable that the thickness of the second metal layer 20 of the roll-bonded body 1 in the present embodiment is equal to or greater than the thickness of the first metal layer 10.

The thickness of the second metal layer 20 is not particularly limited; in the case of an aluminum alloy plate, it is preferable that the thickness is, for example, on the order of 0.05 to 2.5 mm.

A lower limit for the thickness of the second metal layer 20 is preferably 0.1 mm or more, from the viewpoint of processability of the roll-bonded body 1, and is more preferably 0.2 mm or more, taking mechanical strength into account. On the other hand, an upper limit for the thickness of the second metal layer 20 is preferably 1.7 mm or less, from the viewpoint of lightening and cost, and more preferably 1.1 mm or less.

Note that the thickness of the second metal layer 20 was measured by a similar technique to that for the thickness of the first metal layer 10 described above.

<Intermediate Metal Layer>

In FIG. 1(a), the present embodiment has been described by illustrating an example in which the first metal layer and the second metal layer are in direct contact with each other. In the present embodiment, however, the first metal layer and the second metal layer may not be in direct contact with each other, and another layer may be formed between the first metal layer and the second metal layer.

In other words, the roll-bonded body 1 in the present embodiment is not limited to the two-layer configuration and may be configured to include three or more layers. An example in which the roll-bonded body 1 of the present embodiment has a three-layer configuration will be described below, referring to FIG. 1(b).

Figure 1B:
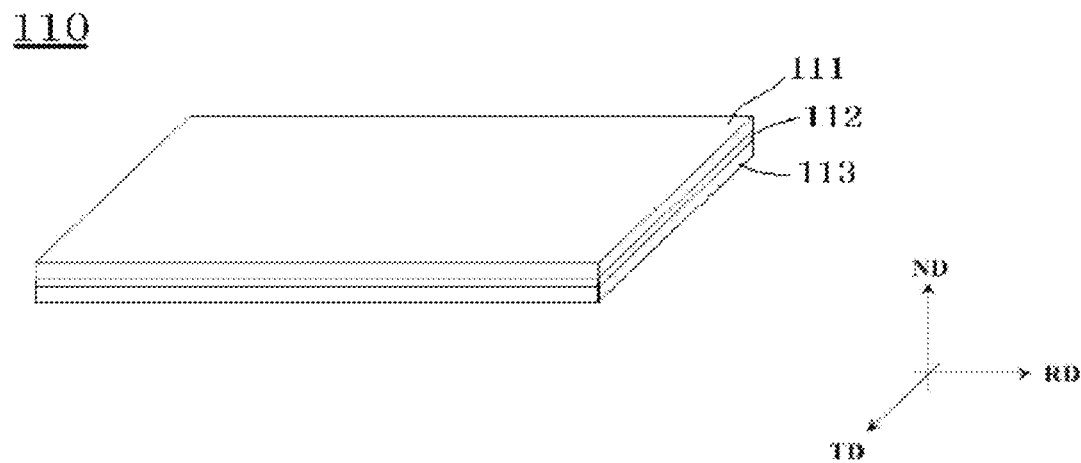

As illustrated in FIG. 1(b), the roll-bonded body in the present embodiment may be a roll-bonded body 110 of a three-layer configuration. In this case, the roll-bonded body 110 includes a first metal layer 111, an intermediate metal layer 112, and a second metal layer 113. In the roll-bonded body 110, the first metal layer 111 is provided on one side of the intermediate metal layer 112, and the second metal layer 113 is formed on a surface on an opposite side of the intermediate metal layer 112 from the first metal layer 111. In other words, the first metal layer 111 and the second metal layer 113 are formed with the intermediate metal layer 112 as a center therebetween, in a sandwich form.

In this case, the first metal layer 111, the intermediate metal layer 112, and the second metal layer 113 may be the same kind of metal, or may be different kinds of metals. In addition, the first metal layer 111 and the second metal layer 113 may be the same kind of metal, while the intermediate metal layer 112 may be a different kind of metal. The kinds of metals applicable as the intermediate metal layer 112 are similar to the above-mentioned examples of the metals applicable as the first metal layer or the second metal layer.

The arithmetic average waviness ($Wa_{11}$) and the maximum waviness height ($Wz_{11}$) of the first metal layer 111 of the roll-bonded body 110 illustrated in FIG. 1(b) are preferably similar values to those of the arithmetic average waviness ($Wa_1$) and the maximum waviness height ($Wz_1$) in the case of the two-layer configuration depicted in FIG. 1(a).

In addition, the arithmetic average waviness ($Wa_{13}$) and the maximum waviness height ($Wz_{13}$) of the second metal layer 113 of the roll-bonded body 110 illustrated in FIG. 1(b) are preferably similar values to those of the arithmetic average waviness ($Wa_2$) and the maximum waviness height ($Wz_2$) in the case of the two-layer configuration depicted in FIG. 1(a).

In the roll-bonded body 110 illustrated in FIG. 1(*b*), thicknesses of the first metal layer 111 and the second metal layer 113 are each preferably, for example, on the order of 0.01 to 0.6 mm. A lower limit for the thicknesses is preferably 0.045 mm or more, and further preferably 0.05 mm or more. On the other hand, an upper limit for the thicknesses is preferably 0.5 mm or less, and further preferably 0.4 mm or less.

Besides, in the roll-bonded body 110 depicted in FIG. 1(*b*), a lower limit for the thickness of the intermediate metal layer is preferably 0.1 mm or more, and further preferably 0.2 mm or more. On the other hand, an upper limit for the thickness is preferably 1.7 mm or less, and further preferably 1.1 mm or less.

<Housing>

The roll-bonded body 1 of the present embodiment is desirably used in such a manner that the first metal layer 10 is used on the outer surface side of an electronic apparatus housing, and the second metal layer 20 is used on the inner surface side of the electronic apparatus housing.

More specifically, in the case where the roll-bonded body 1 is used as a housing (armor case) of a mobile electronic apparatus such as a smart phone, the second metal layer 20 is disposed on the inner surface side for covering a circuit and a power source and the like, and the first metal layer 10 is disposed on the outer surface side corresponding to an external appearance.

Note that in the case where an electronic apparatus housing is produced by use of the roll-bonded body 110 in the present embodiment, the second metal layer 113 is disposed on the inner surface side, and the first metal layer 111 is disposed on the outer surface side.

As a result, heat generated in the circuit and the power source is efficiently diffused by the second metal layer 20 which is lightweight and high in heat radiation property. On the other hand, the first metal layer 10 suppressed in waviness in the surface thereof makes it possible to maintain a beautiful external appearance property even when subjected to mirror polishing, for example.

<Electronic Apparatus Housing>

An electronic apparatus housing including the roll-bonded body 1 of the present embodiment will be described below, referring to the drawings.

Figure 2:
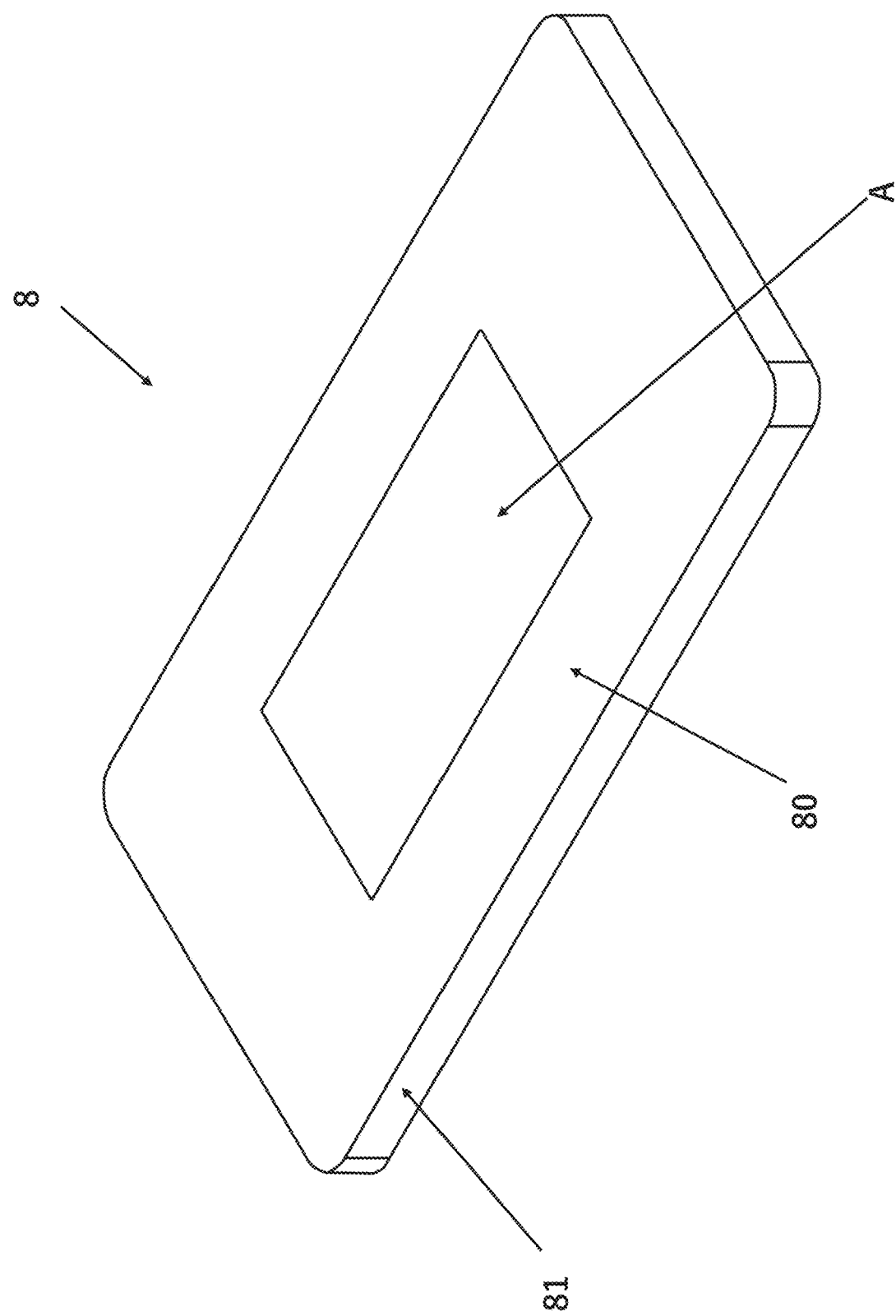
FIG. 2 is a perspective view depicting one embodiment of an electronic apparatus housing according to the present invention.

One example of an electronic apparatus housing 8 produced by processing the roll-bonded body 1 of the present embodiment is illustrated in FIG. 2. The electronic apparatus housing 8 depicted in FIG. 2 is produced by press-forming the roll-bonded body 1 into a desired shape such that the first metal layer 10 is disposed on the outer surface side, and thereafter mirror polishing the outer surface side. In other words, the second metal layer 20 is disposed on the inner surface side of the electronic apparatus housing.

Note that the electronic apparatus housing 8 illustrated in FIG. 2 is an example of processing such that the roll-bonded body 1 of the present embodiment is included at least in a back surface 80 and side surfaces 81. However, in the case of processing the roll-bonded body 1 of the present embodiment into the electronic apparatus housing, the structure depicted in FIG. 2 is not limitative. For example, the roll-bonded body 1 of the present embodiment may be applied to an outer frame (the side surfaces, a top surface and a bottom surface or part of them) of the electronic apparatus housing, or the roll-bonded body 1 of the present embodiment may be applied to a frame in the inside of the electronic apparatus housing. In this case, the back surface of the electronic apparatus housing may be a glass or a resin.

Here, the back surface 80 refers to the surface on the side opposite to a display section (display) of the electronic apparatus. Note that for the purpose of enhancing strength or taking electrical ground or the like, other metallic material than the roll-bonded body, a plastic material or the like may be stacked on the inside of the housing back surface.

In regard of the electronic apparatus housing 8, as depicted in FIG. 2, for example, the waviness of a flat surface section A (for example, 50×100 mm) constituting the housing back surface 80 has a considerable influence on the external appearance property of the electronic apparatus housing, and, hence, of the electronic apparatus as a whole. Specifically, the external appearance property of the electronic apparatus is better as the waviness in the flat surface section A is smaller.

Therefore, it is an object of the roll-bonded body of the present embodiment to control the aforementioned waviness and to thereby enhance the external appearance property of the electronic apparatus housing, and, hence, of the electronic apparatus as a whole.

Note that in regard of the mirror polishing of the surface on the outer surface side of the electronic apparatus housing, it is preferable that the arithmetic average roughness (Ra) is 30 nm or less. Note that the arithmetic average roughness (Ra) is determined according to JIS B 0601:2001.

The method for such mirror polishing may be any method of mechanical polishing such as buff polishing, electrolytic polishing, chemical polishing, and compound polishing involving a combination of these polishing techniques. Note that the mirror polishing does not exclude grinding conducted as a preliminary step thereof.

In addition, the second metal layer 20 disposed on the inner surface side may also be cut, for the purpose of accommodating and fixing a circuit substrate or the like, realizing a further lightening, or the like.

The thickness of a flat part of the electronic apparatus housing produced by forming the roll-bonded body 1 of the present embodiment is 0.2 to 1.7 mm, preferably 0.3 to 1.2 mm, and more preferably 0.3 to 1 mm.

The thickness of the first metal layer 10, in the case of, for example, stainless steel, is 0.045 to 0.5 mm, preferably 0.045 to 0.4 mm, and more preferably 0.045 to 0.3 mm.

On the other hand, the thickness of the second metal layer 20, in the case of, for example, an aluminum alloy, is 0.1 to 1.2 mm, preferably 0.1 to 0.8 mm, and more preferably 0.2 to 0.8 mm.

Note that the electronic apparatus housing including the roll-bonded body 1 of the present embodiment is not limited to the one whose outer surface side is mirror polished, but may be one whose outer surface side has been subjected to decoration processing such as sandblast or hairline.

The roll-bonded body 1 of the present embodiment, having the aforementioned configuration, can obtain an intended decoration effect.

Note that the above-mentioned decoration processing may not be conducted, and the surface of the first metal layer of the roll-bonded body 1 may be utilized as it is.

In addition, a known coating layer is provided, as desired, on the surface on the outer surface side of such an electronic apparatus housing, for the purpose of coloration, prevention of adhesion of fingerprints, prevention of scratching, or the like.

Note that in a case where the coating layer is a nano-level very thin film such as a vapor-deposited film, measurement of the waviness of the housing surface gives a substantially equivalent value to the waviness of the surface of the roll-bonded body mentioned above.

<Production Method for Roll-bonded Body>

The roll-bonded body 1 produced by the production method of the present embodiment is obtained by bonding the first metal layer 10 and the second metal layer 20 to each other by rolling, and is characterized in that the surface of the first metal layer 10 has an arithmetic average waviness ($Wa_1$) of 0.01 to 0.96 μm, and a maximum waviness height ($Wz_1$) of 0.2 to 5.0 μm.

As the method for bonding the first metal layer 10 and the second metal layer 20 to each other by rolling, a known bonding method as follows can be adopted.

First, a cold roll bonding method is a method in which brush polishing or the like is applied to bonding surfaces of the first metal layer 10 and the second metal layer 20, they are laid on each other and are bonded by cold rolling, and thereafter an annealing treatment is conducted, to obtain a roll-bonded body. The step of the cold rolling may be carried out at multiple stages, and temper rolling may be added after the annealing treatment. In this method, roll bonding is performed with a final draft in the range of 20% to 90%.

Note that in the case of producing the roll-bonded body by the cold roll bonding method, the thickness of the original plate is preferably set as follows, taking the above-mentioned draft into consideration.

The thickness of the first metal layer 10 is 0.0125 to 6 mm, preferably 0.056 to 5 mm, and more preferably 0.063 to 4 mm.

In addition, the thickness of the second metal layer 20 is 0.063 to 25 mm, preferably 0.13 to 17 mm, and more preferably 0.25 to 11 mm.

Next, in a hot roll bonding method, brush polishing or the like is similarly applied to the bonding surfaces of the first metal layer 10 and the second metal layer 20, and thereafter they are heated to 200° C. to 500° C. and hot rolled, to be thereby bonded to each other. In this method, roll bonding is performed with a final draft on the order of 15% to 40%.

In the case of producing the roll-bonded body by the hot roll bonding method, the thickness of the original plate is preferably set as follows, taking the above-mentioned draft into consideration.

The thickness of the first metal layer 10 is 0.012 to 1 mm, preferably 0.053 to 0.83 mm, and more preferably 0.059 to 0.067 mm.

Besides, the thickness of the second metal layer 20 is 0.059 to 4.2 mm, preferably 0.19 to 2.8 mm, and more preferably 0.24 to 1.8 mm.

Further, a surface activation bonding method will be described. Note that as the roll bonding method which can suppress waviness in the surface of the roll-bonded body 1, the surface activation bonding method is more preferred.

The surface activation bonding method will be described below in the order of (A) a step of surface treating respective bonding surfaces of the first metal layer 10 and the second metal layer 20, (B) a step of bonding the surface-treated surfaces to each other by pressure welding with a predetermined draft, and (C) a step of performing batch annealing or continuous annealing in a predetermined temperature environment.

As (A) the step of surface treating the respective bonding surfaces of the first metal layer 10 and the second metal layer 20, sputter etching, for example, is preferred. The sputter etching treatment is carried out, for example, as follows.

First, a first metal plate to be the first metal layer 10 and a second metal plate to be the second metal layer 20 are prepared as long coils having a width of the order of 100 to 600 mm, and the first metal plate and the second metal plate are each made to be an electrode on one side that is grounded.

Then, an alternating-current voltage of 1 to 50 MHz is impressed between this electrode and other electrode that is supported in an insulated manner, to generate glow discharge, and a sputter etching treatment is conducted with the area of the electrode exposed to a plasma generated by the glow discharge set to be equal to or less than ⅓ times the area of the other electrode. Note that during the sputter etching treatment, the grounded electrode is in the form of a cooling roll, and the temperatures of the members are thereby prevented from being raised.

In this sputter etching treatment, the surfaces to be bonded of the metal plates are sputtered by an inert gas in vacuum, and thus adsorbed matter on the surfaces is removed and oxide layers on the surfaces are removed partly or completely. As the inert gas, there may be applied, for example, argon, neon, xenon, krypton or the like or a mixed gas containing at least one of them.

In addition, the treatment conditions for the sputter etching can be appropriately adjusted according to the kinds of the metal plate and the like; for example, the sputter etching treatment may be conducted in vacuum with a plasma output of 100 W to 10 kW and a line speed of the order of 0.5 to 30 m/min. As a preferred vacuum in this instance, for example, a vacuum of the order of $1\times10^{-5}$ to 10 Pa can be mentioned as an example.

Next, (B) the step of bonding the surface-treated surfaces to each other by rolling at a predetermined draft will be described.

The rolling of the respective surfaces of the first metal plate and the second metal plate having undergone the above-mentioned sputter etching can be conducted, for example, by rolling with rolls. A linear rolling load in the rolling with rolls is not particularly limited, and may be set, for example, to within the range of 0.1 to 10 tf/cm. For instance, when a roll diameter of the rolls for rolling is 100 to 250 mm, the linear rolling load in the rolling with rolls is more preferably 0.1 to 3 tf/cm, and further preferably 0.3 to 1.8 tf/cm.

Note that from the viewpoint of prevention of re-adsorption of oxygen on the plate surfaces or the like, the bonding by rolling with rolls is preferably performed in a non-oxidizing atmosphere, for example, in vacuum or in an inert gas atmosphere of Ar or the like.

In addition, the predetermined draft in the rolling together of the surfaces of the first metal plate and the second metal plate can be set variously according to the use of the roll-bonded body 1; for example, in the present embodiment, the draft of the roll-bonded body 1 may be 25% or less, preferably 15% or less, and further preferably 10% or less.

According to the surface activation bonding method, generation of waviness during the roll bonding process is little, so that the surface activation bonding method is preferable as a bonding method for the roll-bonded body 1.

Besides, as other example of draft, the draft of the second metal plate can be set variously according to the use of the roll-bonded body 1, and, for suppressing waviness, a draft closer to 0% is more preferred. On the other hand, from the viewpoint of compatibility with the bonding force between the first metal plate and the second metal plate, the draft, in a case where the second metal plate is an aluminum alloy plate, may be, for example, 5% to 18%.

On the other hand, in regard to a lower limit for the draft of the first metal plate, a value nearer to 0% is more preferred for suppressing waviness. On the other hand, for enhancing the bonding force between the first metal plate and the second metal plate, the lower limit may be 0.5% or more, and more preferably 2% or more. Besides, in regard of an upper limit for the draft of the first metal plate, the upper limit may be preferably 10% or less, and more preferably 8% or less.

In consideration of the above-mentioned draft, the thicknesses of the original plates in the surface activation bonding method are preferably set as follows.

The thickness of the first metal layer 10 is 0.01 to 0.8 mm, preferably 0.045 to 0.67 mm, and more preferably 0.05 to 0.053 mm.

In addition, the thickness of the second metal layer 20 is 0.05 to 3.3 mm, preferably 0.1 to 2.3 mm, and more preferably 0.2 to 1.5 mm.

Next, (C) the step of performing batch annealing or continuous annealing in a predetermined temperature environment will be described.

The roll-bonded body 1 obtained by the roll bonding mentioned above may be subjected further to a heat treatment, as required. By the heat treatment, strain at the interface between the first metal layer 10 and the second metal layer 20 is removed, and adhesion at the interface can be further enhanced. In addition, for example, in the case where the second metal layer 20 is an aluminum alloy layer, the heat treatment can serve also as annealing, and, therefore, this heat treatment is referred to also as "annealing."

The temperature of such a heat treatment (annealing), to which the roll-bonded body 1 is to be heated, for example, in a case where the metal layers are a stainless steel layer and an aluminum alloy layer, may be, for example, 200° C. to 370° C. in the case of batch annealing, and may be, for example, 300° C. to 800° C. in the case of continuous annealing. In this heat treatment, in the case where the second metal layer 20 is an aluminum alloy layer, metallic elements (in the case of stainless steel, for example, Fe, Cr, Ni) contained in the first metal layer 10 (for example, stainless steel) are thermally diffused into the second metal layer 20. Note that the metallic elements contained in the first metal layer 10 and the metallic elements contained in the second metal layer 20 may be mutually thermally diffused.

Note that the time of the heat treatment (annealing) can be appropriately set according to the type of the heat treatment (batch or continuous) and the size of the roll-bonded body 1. As an example, in the case of a batch treatment, after the roll-bonded body 1 reaches the above-mentioned target temperature, soaking holding may be performed for 0.5 to 10 hours. On the other hand, in the case of a continuous treatment, after the roll-bonded body 1 reaches the above-mentioned target temperature, soaking holding may be performed for 20 seconds to 5 minutes.

The method of producing the roll-bonded body of the present embodiment has been described above by taking as an example the case where the roll-bonded body has a two-layer configuration of the first metal layer and the second metal layer. Note that where the roll-bonded body has the three-layer configuration having the intermediate metal layer between the first metal layer and the second metal layer, also, similar production to the above-mentioned can be carried out. In that case, the first metal layer and the intermediate metal layer may first be bonded to each other, followed by bonding the second metal layer, or the intermediate metal layer and the second metal layer may first be bonded to each other, followed by bonding the first metal layer. In addition, a method of simultaneously bonding the first metal layer, the intermediate metal layer, and the second metal layer may also be adopted.

In the method of producing the roll-bonded body 1 of the present embodiment, particularly, after the first metal plate and the second metal plate are bonded to each other, a "shape correction step" and a "plate passing step" as follows are preferably conducted further. Note that the "shape correction step" and the "plate passing step" are preferably applicable, in the cases where the method of bonding the first metal plate and the second metal plate is any of the cold roll bonding method, the hot roll bonding method, and the surface activation bonding method.

First, the "shape correction step" will be described. The roll-bonded body 1 obtained by the above-mentioned roll bonding may have warpage after processing, due to the difference in properties between the different kinds of metals, or the like. For correcting the warpage, therefore, passing the roll-bonded body 1 through a line called tension leveler, for example, is conducted.

More specifically, the roll-bonded body 1 obtained by the roll bonding is passed while making contact with correction rolls arranged in the RD direction, while applying a predetermined tension in regard of the RD direction, for example.

In this instance, at the time of passing the roll-bonded body 1 while making contact with the correction rolls, the roll-bonded body 1 is passed on the correction rolls such that the roll-bonded body 1 is warped to the direction opposite to the direction of the warpage generated upon the roll bonding, and, further, on the next rolls, the roll-bonded body 1 is passed on the correction rolls such that the roll-bonded body 1 is warped in the direction of the warpage generated upon the roll bonding. In this way, inversion of warping of the roll-bonded body 1 is repeated continuously, and the warpage of the roll-bonded body 1 is thereby corrected.

Note that the roll-bonded body having undergone the shape correction step is normally taken up into a coil form.

Figure 3:
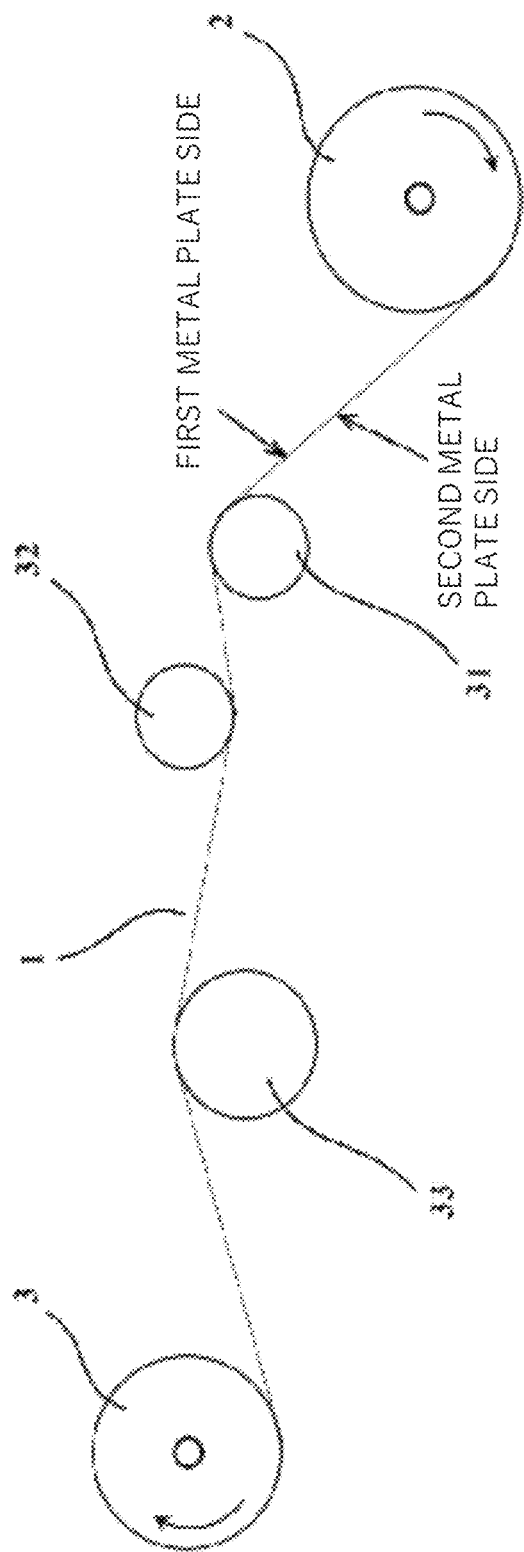
FIG. 3 is a diagram depicting one example of a method of suppressing waviness in the present embodiment.

Next, the "plate passing step" will be described referring to FIG. 3. FIG. 3 is a schematic diagram depicting a re-winding step as an example of a step including the plate passing step, that is conducted after the shape correction step.

The roll-bonded body after the shape correction step is normally stored in the state of being wound in a coil form, as aforementioned. Then, before shipping, a need to re-wind the coil formed roll-bonded body, or to cut the roll-bonded body to cut out a part thereof, is generated according to a production line at the destination. In addition, a need to change the kind and/or the diameter of the core of the coil, for example, may be generated according to the production line at the destination.

In an after-step following the shape correction step, conducted for such a purpose, a "plate passing step" of passing the roll-bonded body through one or a plurality of rolls, such as the re-winding step depicted in FIG. 3, is included. In the present embodiment, description will be made by taking the re-winding step as an example.

In the re-winding step, as depicted in FIG. 3, a belt form roll-bonded body 1 is drawn out from the coil formed roll-bonded body 2, and is re-wound into a coil formed roll-bonded body 3 having a desired coil diameter through a plate passing equipment including a 1st roll 31, a 2nd roll 32, and a 3rd roll 33. Note that the number of the rolls in the re-winding step is three in the schematic diagram of FIG. 3, but this is not limitative, and the number of rolls can be changed according to the size of the plate passing equipment.

In the re-winding step of the present embodiment, at least the roll (in FIG. 3, the 3rd roll 33) immediately before take-up (winding) into the coil formed roll-bonded body 3 is preferably a roll having an outside diameter of 200 mm or more. Note that an upper limit for the outside diameter is prescribed according to the size of the plate passing equipment and the distance between roll axes. Besides, preferably, the outside diameters of all the rolls may be 200 mm or more.

In addition, the surface at which the roll-bonded body 1 drawn out from the coil formed roll-bonded body 2 makes contact with the first roll (in FIG. 3, the 1st roll 31) is preferably a surface not on the external appearance side when the roll-bonded body is formed into a housing (in FIG. 3, a surface on the second metal layer 20 side). Subsequently, the plate passing is conducted such that the first metal layer 10 side makes contact with the 2nd roll 32, and further the second metal layer 20 side makes contact with the 3rd roll 33.

Thus, in the present embodiment, it is characteristic that the surface of the second metal layer 20 of the roll-bonded body 1 is first put into contact with the 1st roll 31, in the plate passing step after the shape correction step, and the outside diameter of at least the roll on the step finishing end side (immediately before take-up (winding)) of the rolls used is 200 mm or more.

By this, plate passing can be performed in such a manner that generation of new waviness during plate passing is restrained, and the arithmetic average waviness ($Wa_1$) of the surface of the first metal layer 10 after the shape correction step is kept in the range of 0.01 to 0.96 μm and the maximum waviness height ($Wz_1$) of the surface is kept in the range of 0.2 to 5.0 μm.

By the above steps, the roll-bonded body 1 of the present embodiment can be obtained. The roll-bonded body 1 thus obtained can be used for covers, housings, and cases applied to mobile electronic apparatuses such as smart phones and notebook personal computers (PCs), various electronic apparatus such as PCs, electronic members for transport equipment such as automobiles, electronic members for home electric appliances, and so on. Further, the roll-bonded body obtained can be utilized as a functional member such as various reinforcement members, heat radiation and electromagnetic wave shield, etc.

EXAMPLES

The present invention will be described below by way of Examples, but the present invention is not limited to these Examples.

Example 1

A roll-bonded body (thickness: 0.96 mm) of a stainless steel plate and an aluminum alloy plate was prepared by a surface activation bonding method. First, as a metal plate to be the first metal layer 10, a stainless steel plate (SUS304) 0.25 mm in thickness was used, and an aluminum alloy plate (A5052) 0.8 mm in thickness was used as the second metal layer 20. Sputter etching was applied to SUS304 and A5052. The sputter etching for SUS304 was carried out under the conditions of a plasma output of 700 W for 13 minutes at a pressure of 0.1 Pa, and the sputter etching for A5052 was carried out under the conditions of a plasma output of 700 W for 13 minutes at a pressure of 0.1 Pa.

SUS304 and A5052 after the sputter etching treatment were bonded by roll pressure welding at normal temperature at a rolling roll diameter of 130 to 180 mm, a linear rolling load of a pressing force of 1.9 to 4.0 tf/cm, to obtain a roll-bonded body of SUS304 and A5052. The roll-bonded body was subjected to batch annealing under the conditions of 300° C. for 2 hours.

In the roll-bonded body thus obtained, the thickness of the stainless steel layer was 0.24 mm, and the thickness of the aluminum alloy layer was 0.72 mm.

Subsequently, for removing warpage of the roll-bonded body, the roll-bonded body was subjected to shape correction by use of a tension leveler, then was slit in parallel to the RD direction by a slitter into two stripes, after which the roll-bonded body was taken up in a coil form.

Figure 4:
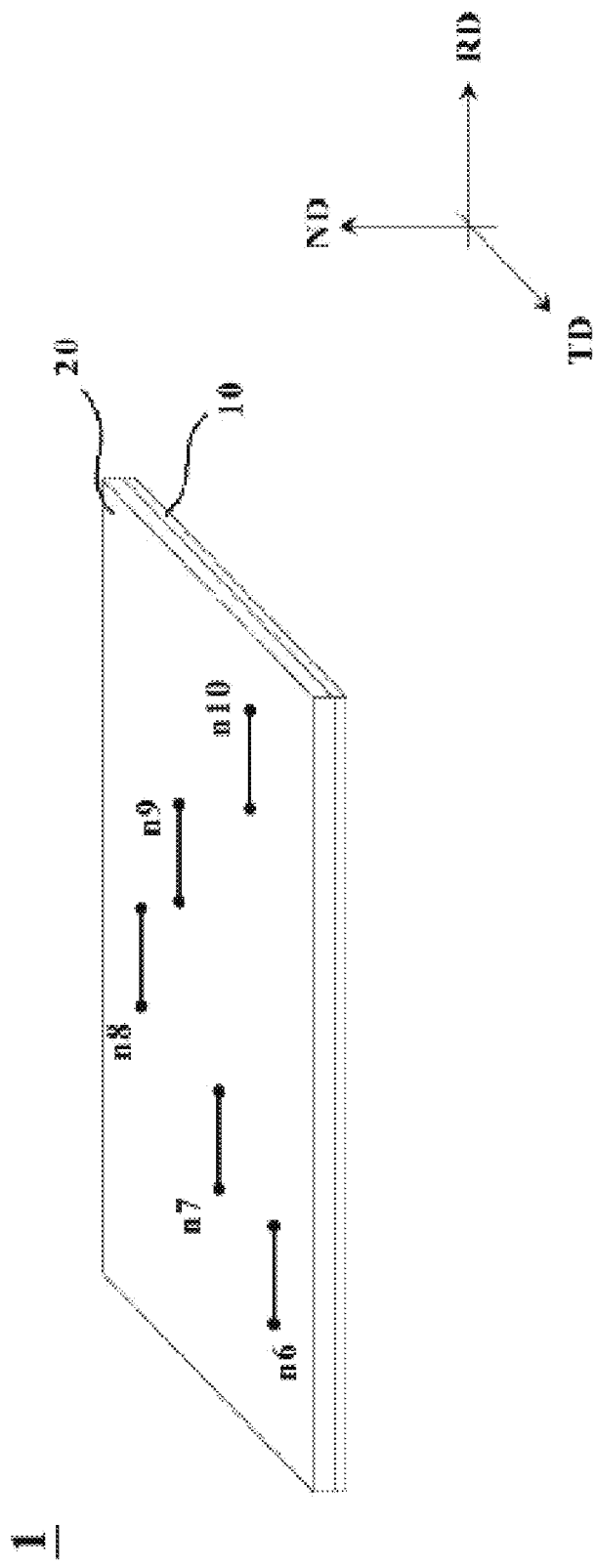
FIG. 4 is a diagram depicting a method for obtaining a waviness curve in the present example.

As illustrated in FIG. 4, a plate measuring 50×100 mm was cut out as a sample from the roll-bonded body, and, at arbitrary five locations (n6 to n10) on the aluminum alloy plate side, a waviness curve was obtained using a contact probe profilometer (surfcom 1400D-3DF, produced by Tokyo Seimitsu Co., Ltd.). The measuring direction was the rolling (RD) direction.

In addition, through illustration is omitted, also on the stainless steel plate 10 side, measurement curves are measured at arbitrary five locations (n1 to n5) using the contact probe profilometer (surfcom 1400D-3DF, produced by Tokyo Seimitsu Co., Ltd.) similarly to the above, and filtering at cut-off values is sequentially conducted from the measurement curves, to obtain a profile curve and a waviness curve.

Note that the measuring conditions for measurement by the contact probe profilometer was set as follows, according to JIS B 0601:2001.

Pick-up: Standard pick-up
Kind of measurement: Wave filtration center line waviness measurement
Measurement length: 40.0 mm
Cut-off wavelength: 2.5 to 25 mm
Measurement speed: 0.3 mm/s
Kind of cut-off: Gaussian
Inclination correction: Least squares curve correction The measurement results obtained by the contact probe profilometer in Example 1 are depicted in FIGS. 5A and 5B.

Example 2

After a roll-bonded body was slit in parallel to the RD direction by a slitter into two stripes, the coil formed roll-bonded body was re-wound into another coil by use of a re-winding device including a roll having an outside diameter of 200 mm. In that instance, the aluminum alloy side was put into contact with the first roll. In other points, a similar process to Example 1 was conducted, to obtain a sample.

Figure 5A:
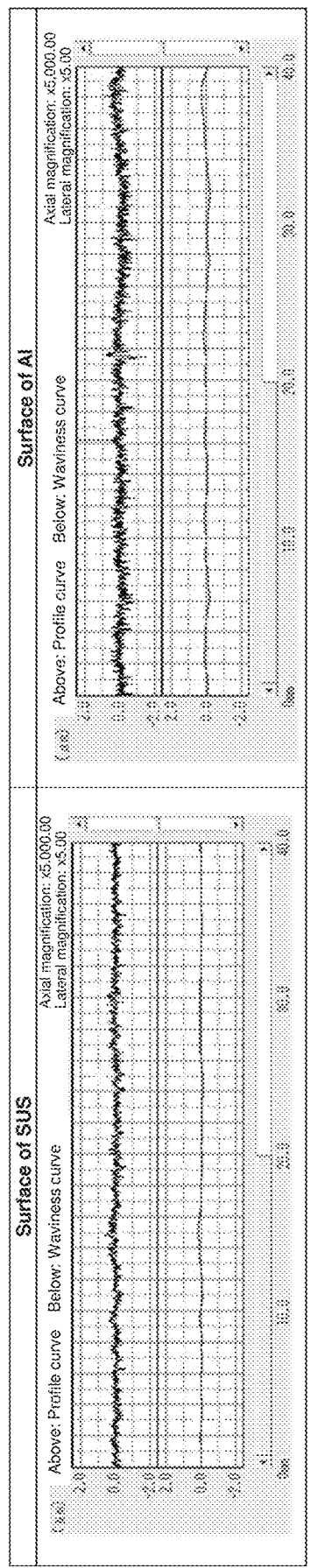
FIGS. 5A and 5B are a diagram depicting a waviness curve before mirror polishing in Examples.
Figure 5A:
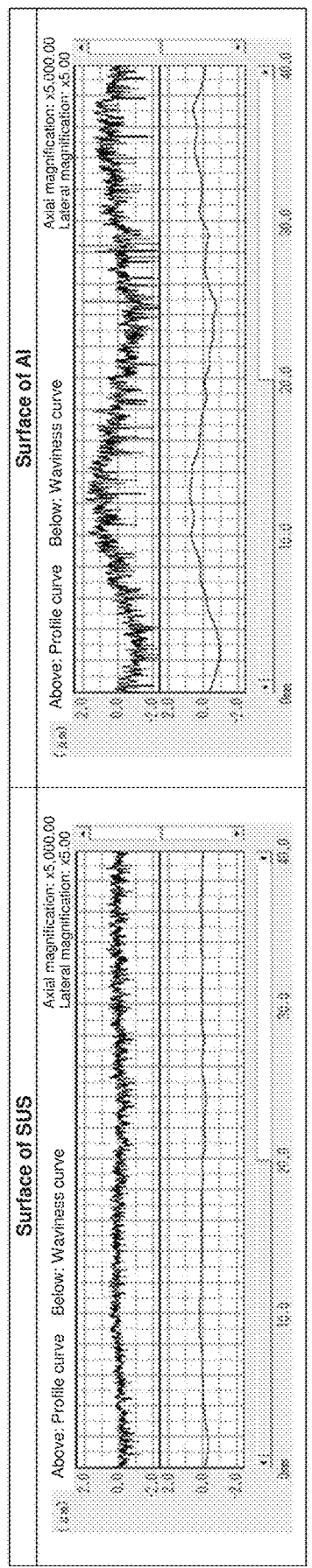
Figure 5B:
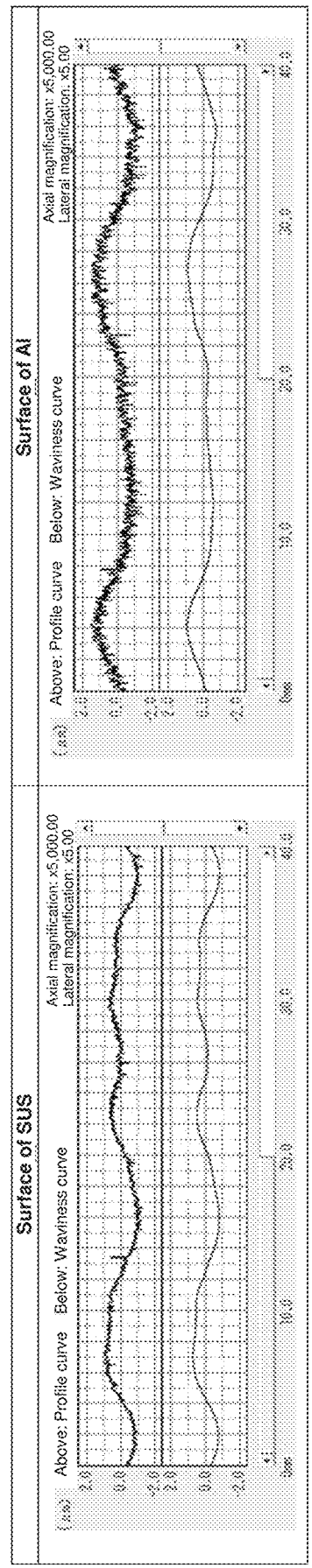
Figure 5B:
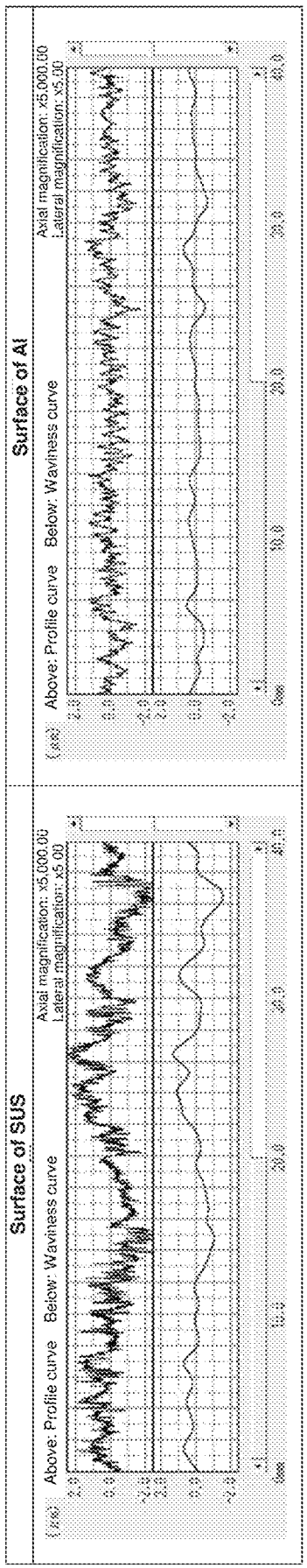

The measurement results obtained by a contact probe profilometer in Example 2 are depicted in FIGS. 5A and 5B.

Example 3

A sample was obtained similarly to Example 1, except that after shape correction, a roll-bonded body was passed through a shearing device to cut the roll-bonded body in the RD direction on the basis of 300 mm into sheets.

The shearing device included a plurality of rolls having an outside diameter of 50 mm, and only the roll on the finishing end side had an outside diameter of 200 mm.

The measurement results obtained by a contact probe profilometer in Example 3 are depicted in FIGS. 5A and 5B.

Example 4

A roll-bonded body (thickness: 1.00 mm) of a stainless steel plate and an aluminum alloy plate was prepared by use of the cold roll bonding method. The thickness of the stainless steel layer was 0.29 mm, and the thickness of the aluminum alloy layer was 0.73 mm. A plate measuring 50×100 mm was cut out from the roll-bonded body as a sample, and by a similar method to that in Example 1, a waviness curve by measurement by a contact probe profilometer was obtained.

The measurement results obtained by the contact probe profilometer in Example 4 are depicted in FIGS. 5A and 5B.

Example 5

A roll-bonded body (thickness: 0.6 mm) of a stainless steel plate and an aluminum alloy plate was prepared by use of the cold roll bonding method. The thickness of the stainless steel layer was 0.16 mm, and the thickness of the aluminum alloy layer was 0.44 mm. A plate measuring 50×100 mm was cut out from the roll-bonded body as a sample, and by a similar method to that in Example 1, a waviness curve was obtained by measurement by a contact probe profilometer.

Figure 5C:
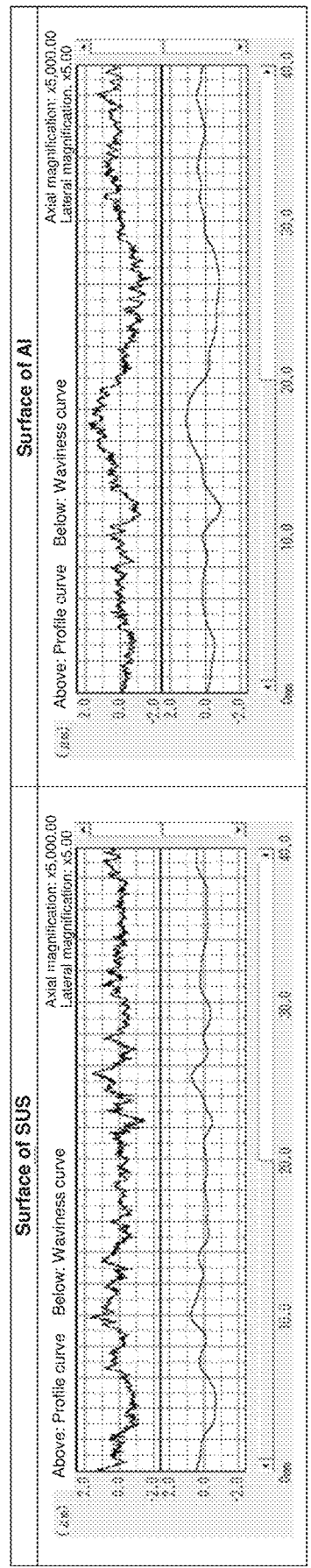
FIGS. 5C and 5D are a diagram depicting a waviness curve before mirror polishing in Examples.
Figure 5C:
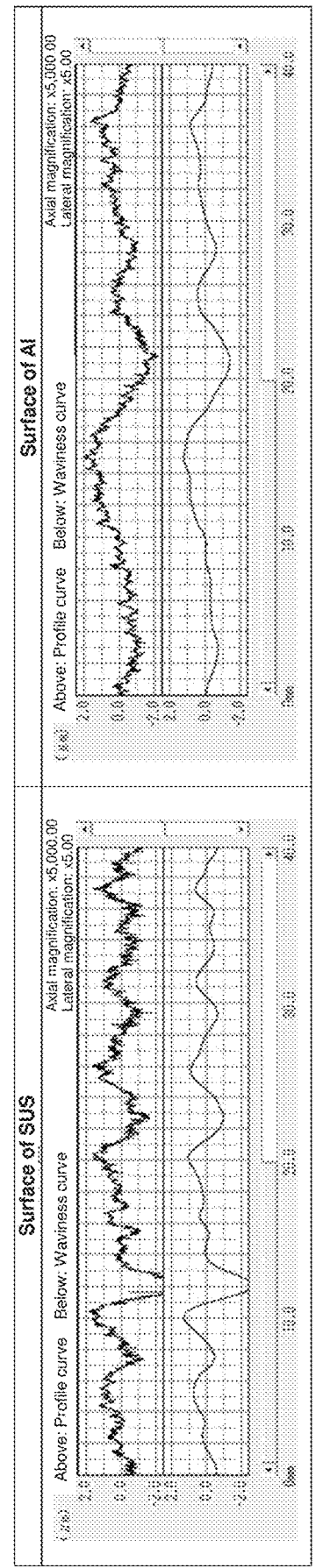
Figure 5D:
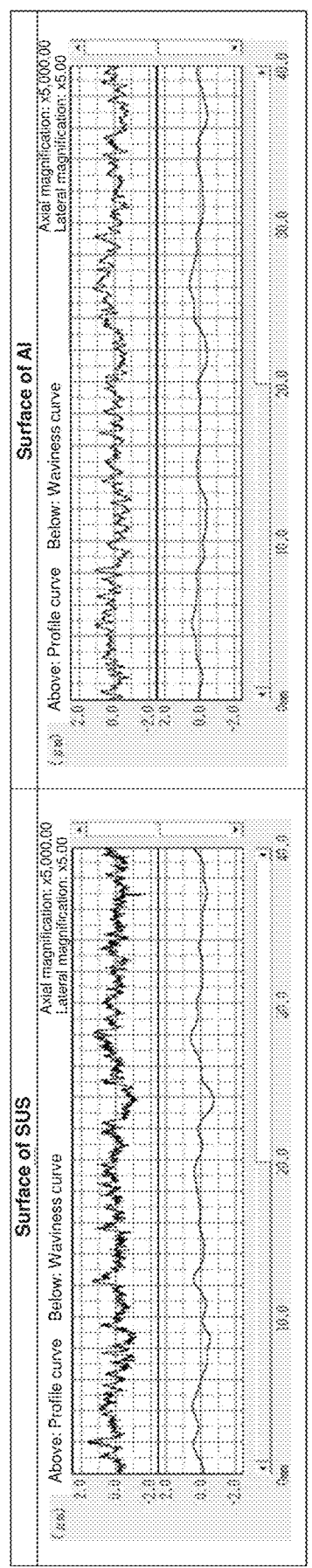
Figure 5D:
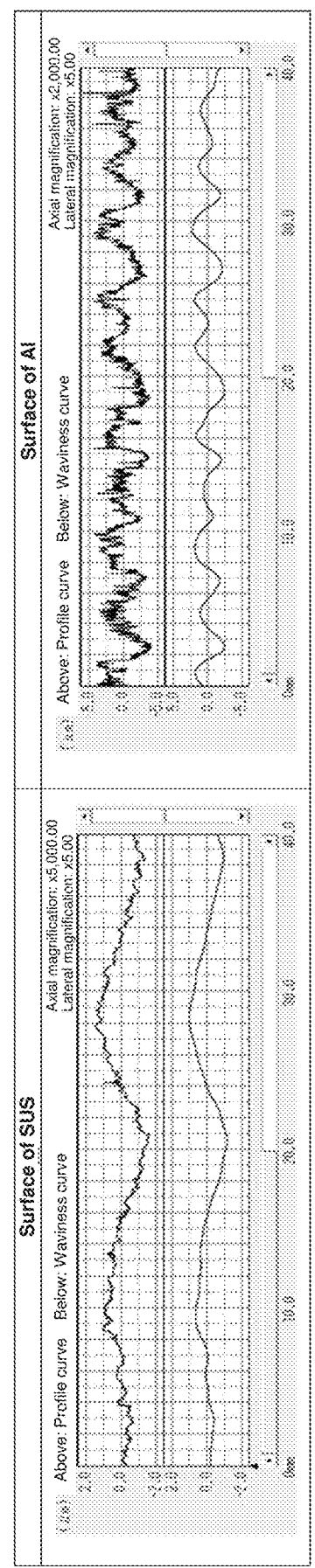

The measurement results obtained by the contact probe profilometer in Example 5 are depicted in FIGS. 5C and 5D.

Example 6

A roll-bonded body (thickness: 0.55 mm) of a stainless steel plate and an aluminum alloy plate was prepared by the cold roll bonding method. The thickness of the stainless steel layer was 0.11 mm, and the thickness of the aluminum alloy layer was 0.42 mm. A plate measuring 50×100 mm was cut out from the roll-bonded body as a sample, and by a similar method to that in Example 1, a waviness curve was obtained by measurement by a contact probe profilometer.

The measurement results obtained by the contact probe profilometer in Example 6 are depicted in FIGS. 5C and 5D.

Example 7

A roll-bonded body (thickness: 0.4 mm) of a stainless steel plate and an aluminum alloy plate was prepared by use of the cold roll bonding method. The thickness of the stainless steel layer was 0.2 mm, and the thickness of the aluminum alloy layer was 0.2 mm. A plate measuring 50×100 mm was cut out from the roll-bonded body as a sample, and by a similar method to that in Example 1, a waviness curve was obtained by measurement by a contact probe profilometer.

The measurement results obtained by the contact probe profilometer in Example 7 are depicted in FIGS. 5C and 5D.

Example 8

A roll-bonded body (thickness: 1.0 mm) of a stainless steel plate and an aluminum plate (A1100) was prepared by use of the hot roll bonding method. The thickness of the stainless steel layer was 0.27 mm, and the thickness of the aluminum layer was 0.73 mm. A plate measuring 50×100 mm was cut out from the roll-bonded body as a sample, and by a similar method to that in Example 1, a waviness curve was obtained by measurement by a contact probe profilometer.

The measurement results obtained by the contact probe profilometer in Example 8 are depicted in FIGS. 5C and 5D.

Comparative Example 1

After a roll-bonded body was slit in parallel to the RD direction by a slitter into two stripes, the coil formed roll-bonded body was re-wound into another coil by use of a re-winding device including a roll having an outside diameter of 50 mm. In that instance, the stainless steel side was put into contact with the first roll. In other points, a similar process to Example 2 was conducted, to obtain a sample.

Figure 6:
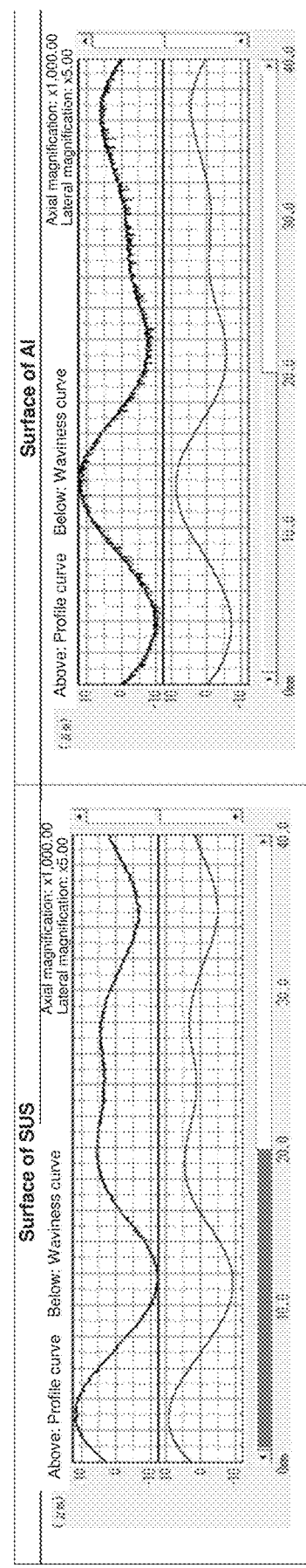
FIG. 6 is a diagram depicting a waviness curve before mirror polishing in Comparative Example.

The measurement results obtained by a contact probe profilometer in Comparative Example 1 are depicted in FIG. 6.

<External Appearance Evaluation before Mirror Polishing>

In regard of each of the samples in Examples 1 to 8 and Comparative Example 1, the state of visually confirmable waviness was evaluated as follows.

(Contents of Evaluation)

Excellent: Having extremely little visually confirmable waviness, and being preferable for practical use.

Good: Having little visually confirmable waviness, and being preferable for practical use.

Fair: Having somewhat much visually confirmable waviness, but being applicable to practical use.

Poor: Having much visually confirmable waviness, and being not suitable for practical use.

Numerical values obtained from waviness curves before mirror polishing measured in Examples 1 to 8 and Comparative Example 1 are set forth in Table 1.

<Image Clarity Evaluation before Mirror Polishing>

By use of a surface distortion pattern measuring instrument (instrument name: SurfRiDY-kit, produced by JFE Techno-Research Corporation), inclination angle distribution in the rolling direction was measured for the whole stainless steel surface of each of the samples in Examples 1, 2, 4, and 8 and Comparative Example 1. Note that the size of each sample was 25×100 mm to 50×100 mm. Based on the inclination angle distribution obtained, that in an arbitrary range of 1,800 to 5,000 mm$^2$ in the sample surface was converted into curvature distribution, and then a standard deviation, a maximum, a minimum, an absolute value obtained by differentiating the maximum and the minimum, of the curvature distribution, and a curvature distribution diagram were determined. Note that for Examples 2 and 4 and Comparative Example 1, since the mirror property of the surface was low and it was difficult to measure the inclination angle distribution, sewing-machine oil was applied to the surface before measuring the inclination angle distribution.

Note that the measuring conditions for inclination angle distribution were as follows.

<General Observation Conditions>

Projection width Wp of pattern P: 480 mm
Screen-sample distance Dss: 740 mm
Sample-camera distance Dsc: 740 mm
Camera height Hc: 215 mm
Camera central visual field width We (not illustrated): 125 mm <Camera Observation Conditions>

Camera: monochromatic charge coupled device (CCD)
Lens: f=28 mm, F22
Imaging period: 30 fps In addition, an analyzing method for curvature distribution is set forth below.

First, a curvature distribution A was calculated from the inclination angle distribution of each sample surface by use of the following conversion and display conditions. Next, the curvature distribution A was smoothed in the range of ±60 pixels, to form a curvature distribution B. Then, by differentiating the curvature distribution B from the curvature distribution A, a curvature distribution C in which low-frequency components of the material surface were removed was formed. From the curvature distribution C, the image clarity is evaluated.

Figure 7:
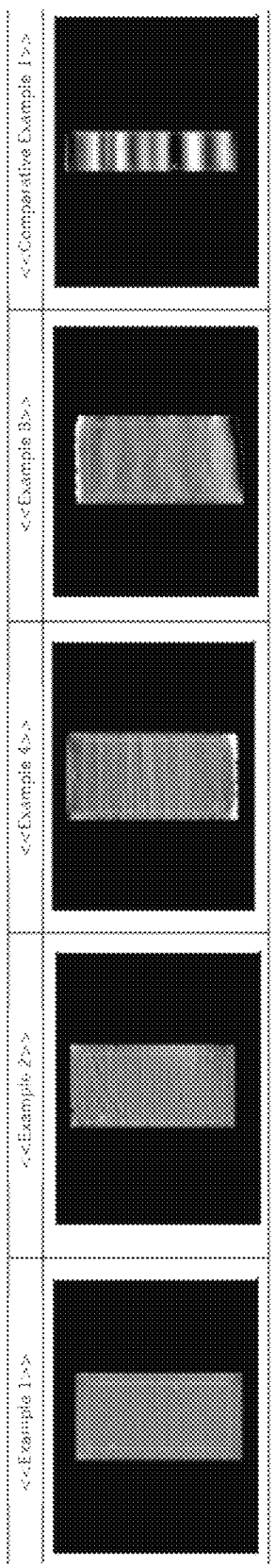
FIG. 7 is a diagram depicting curvature distributions before mirror polishing in Examples and Comparative Example.
Figure 8A:
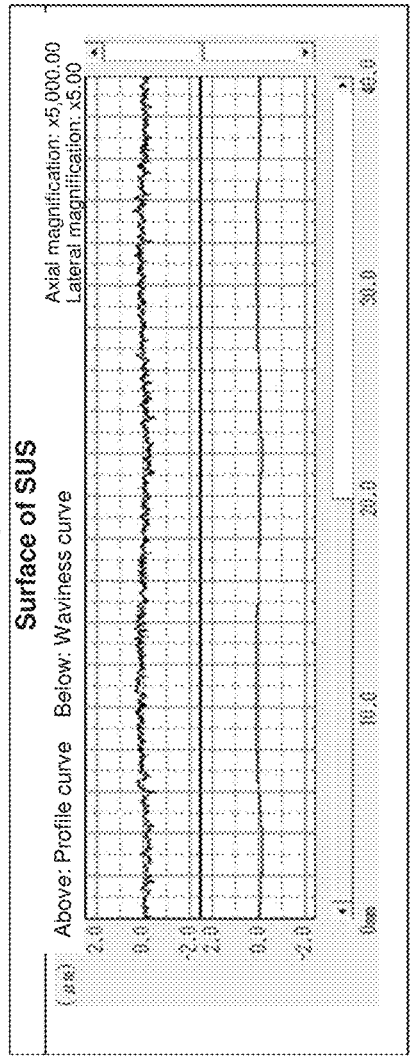
FIGS. 8A and 8B are a diagram depicting a waviness curve after mirror polishing in Examples.
Figure 8A:
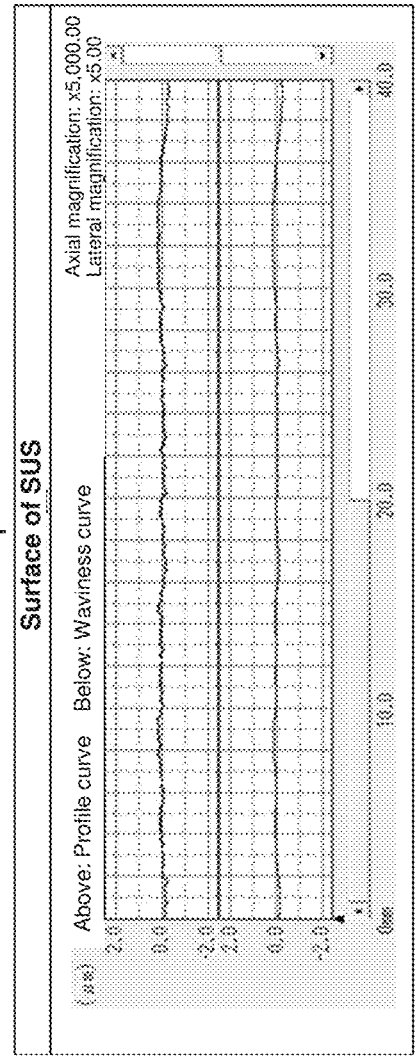
Figure 8B:
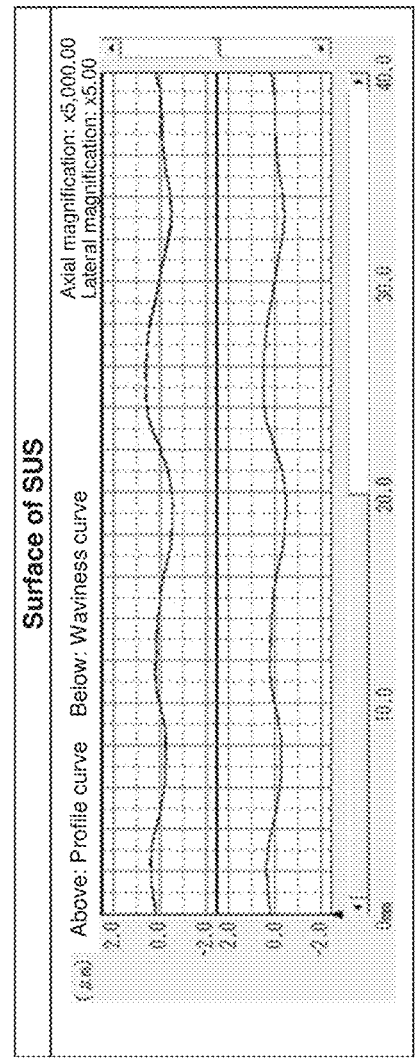
Figure 8C:
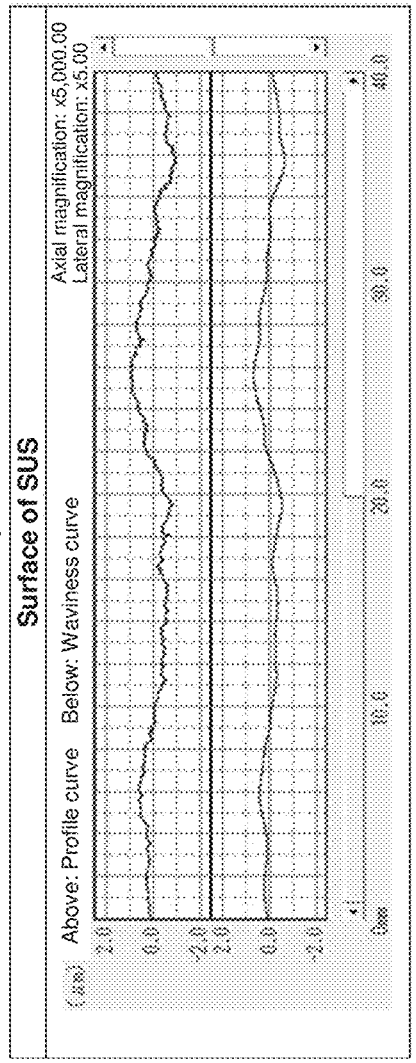
FIGS. 8C and 8D are a diagram depicting waviness curves after mirror polishing in Examples and Comparative Example.
Figure 8C:
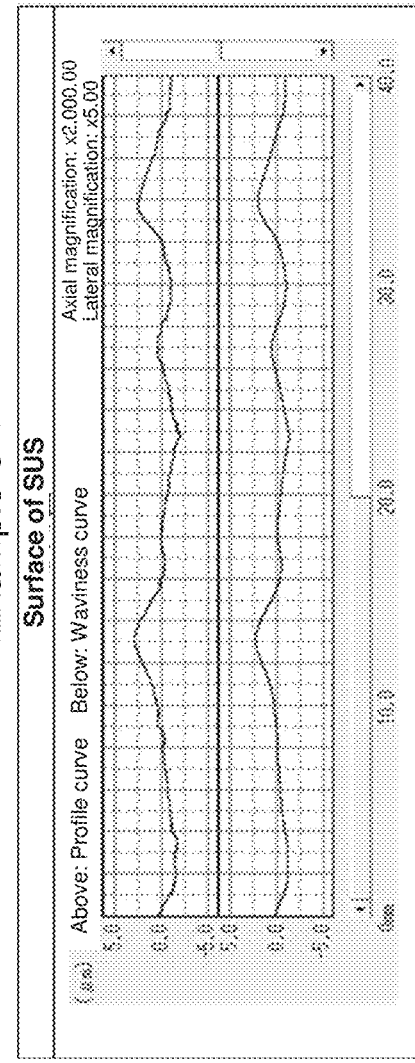
Figure 8D:
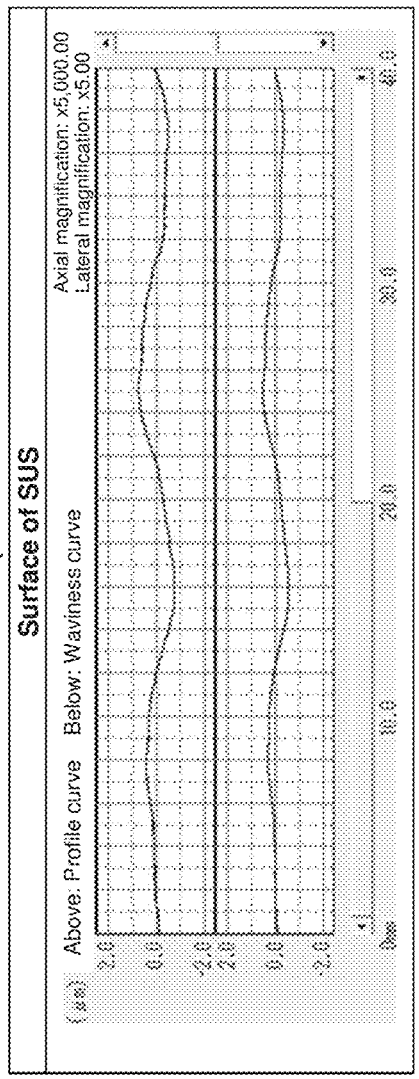
Figure 8D:
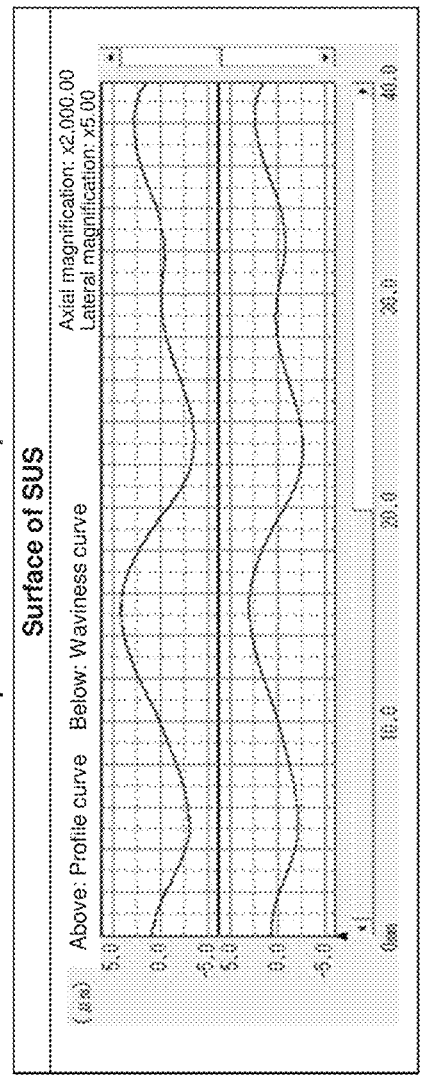

<Conversion and Display Conditions>
Surface distortion: gra/curvature
Magnification ratio: 85%
Differentiation width: 1 mm
Movement average width: ±1 pixel
Display gain: 8
Negative/positive: positive The image clarity evaluations for Examples 1, 2, 4, and 8 and Comparative Example 1 before mirror polishing measured in Examples 1 to 8 and Comparative Example 1 are set forth in Table 1. In addition, curvature distribution diagrams are depicted in FIG. 7.

Note that at the time of determining the arithmetic average roughness ($Ra_1$) and the maximum height roughness (Rz), the measuring conditions by the contact probe profilometer were set as follows, according to JIS B 0601:2001.

Pick-up: standard pick-up
Kind of measurement: roughness measurement
Measurement length: 0.4 mm
Cut-off value
$\lambda s$: 2.5 μm
$\lambda c$: 0.08 mm
Measurement speed: 0.3 mm/s
Kind of cut-off: Gaussian
Inclination correction: least squares curve correction <External Appearance Evaluation after Mirror Polishing>

The samples in Examples 1, 2, 4, and 6 and Comparative Example 1 were each subjected to mirror polishing by buff polishing with diamond slurry, after which a light source was mirrored on each of the mirror-polished surfaces, and the manner of mirroring and the manner of distortion were visually confirmed, and were evaluated as follows.

(Contents of Evaluation)

Excellent: Having extremely little distortion of the image, and being preferable for practical use.

TABLE 1

| | Waviness before mirror polishing | | | | Evaluation of external appearance before mirror polishing | Evaluation of external appearance after mirror polishing | Evaluation results of image clarity of first metal layer (SUS) before mirror polishing | | | |
|---|---|---|---|---|---|---|---|---|---|---|
| | SUS side | | AL side | | | | Statistic of curvature distribution (μrad/mm) | | | |
| | Wa1 [μm] | Wz1 [μm] | Wa2 [μm] | Wz2 [μm] | | | Standard deviation | Maximum | Minimum | \|Maximum − Minimum\| |
| Example 1 | 0.053 | 0.307 | 0.073 | 0.428 | Excellent | Excellent | 47.5 | 200.5 | −198 | 398.5 |
| Example 2 | 0.153 | 0.684 | 0.302 | 1.538 | Excellent | Excellent | 123.7 | 775.8 | −1047 | 1822.8 |
| Example 3 | 0.465 | 1.751 | 0.477 | 1.898 | Good | Good | — | — | — | — |
| Example 4 | 0.512 | 3.140 | 0.341 | 2.003 | Good | Good | 144 | 630 | −511.4 | 1141.4 |
| Example 5 | 0.268 | 1.530 | 0.340 | 1.722 | Good | Good | — | — | — | — |
| Example 6 | 0.439 | 3.065 | 0.395 | 2.218 | Fair | Fair | — | — | — | — |
| Example 7 | 0.216 | 1.271 | 0.237 | 1.356 | Good | Good | — | — | — | — |
| Example 8 | 0.449 | 1.948 | 0.995 | 5.005 | Good | Good | 155 | 637.4 | −495.9 | 1133.3 |
| Comparative Example 1 | 3.837 | 18.453 | 3.889 | 16.800 | Poor | Poor | 728.2 | 2071.7 | −2264.7 | 4336.4 |

As indicated in Table 1 and FIG. 7, the roll-boned body of the present embodiment had little waviness before mirror polishing, and exhibited excellent image clarity. This means little distortion of the surface of the roll-bonded body, and indicates excellent external appearance property.

On the other hand, the roll-bonded body of Comparative Example 1 had a value of an absolute value (|maximum-minimum|) of the maximum and the minimum of the curvature distribution of 4,000 (grad/mm) or more, as set forth in Table 1, in image clarity evaluation before mirror polishing, which means that a problem as to external appearance property was left.

Note that the above-described embodiment and Examples may be variously modified within such ranges as not to depart from the gist of the present invention.

<Waviness after Mirror Polishing>

For Examples 1 to 4, 6, and 8 and Comparative Example 1 of the samples having undergone mirror polishing, profile curves and waviness curves were obtained by the contact probe profilometer similarly to Example 1. These are depicted in FIGS. 8A, 8B, 8C and 8D. In addition, numerical values which can be obtained therefrom are set forth in Table 2.2.

Good: Having little distortion of the image, and being preferable for practical use.

Fair: Having somewhat much distortion of the image, but being applicable to practical use.

Poor: Having much distortion of the image, and being not suitable for practical use.

Numerical values obtained from the waviness curves after the mirror polishing measured and the roughness after the mirror polishing are set forth in Table 2.

<Image Clarity Evaluation after Mirror Polishing>

Figure 9:
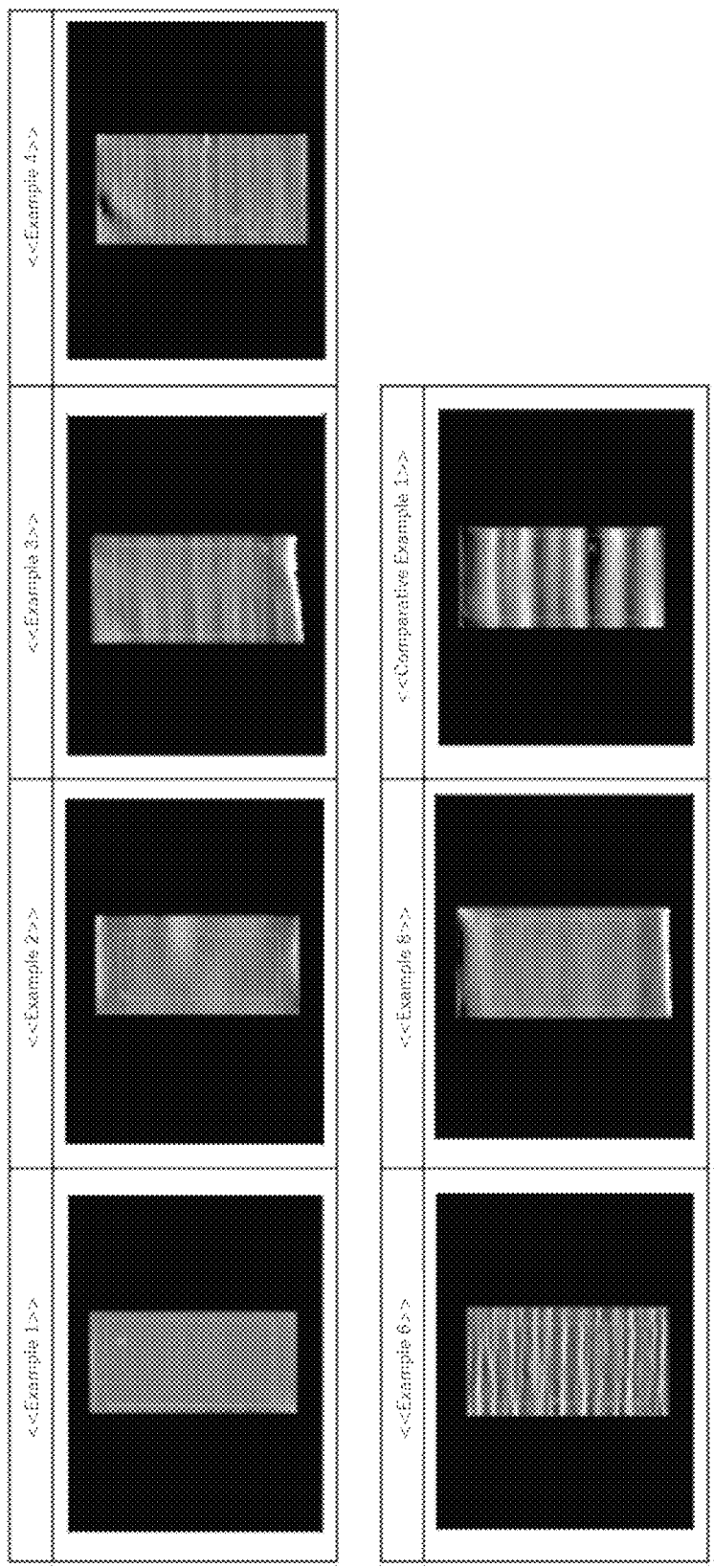
FIG. 9 is a diagram depicting curvature distributions after mirror polishing in Examples and Comparative Example.
Figure 10:
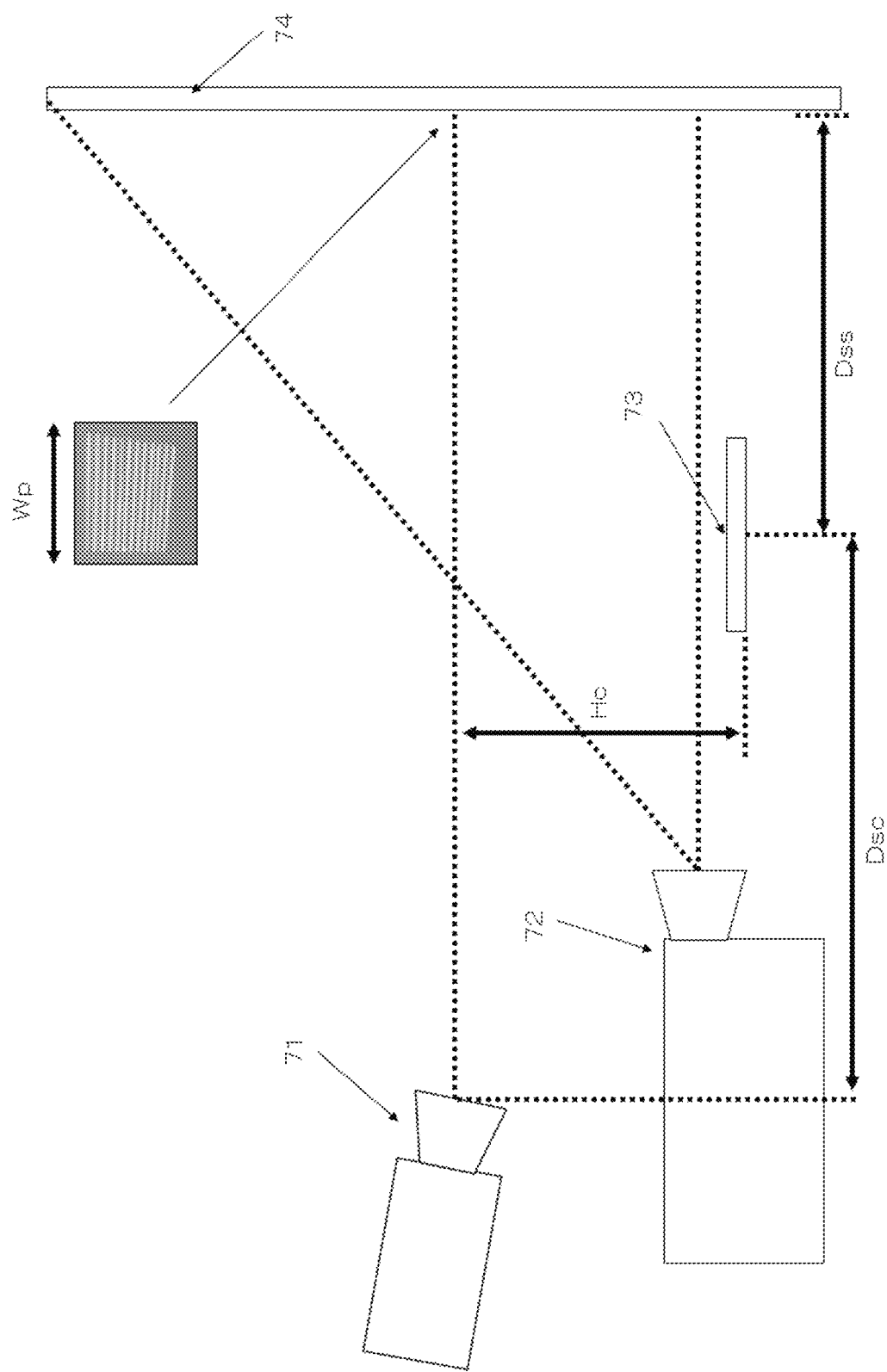
FIG. 10 is a schematic diagram depicting an external appearance of a measuring optical system of an image clarity evaluation device (measured surface strain pattern measuring device).

For the whole stainless steel surfaces of the samples in Examples 1, 2, 3, 4, 6, and 8 and Comparative Example 1 after the mirror polishing, inclination angle distribution in the rolling direction was measured by use of the surface distortion pattern measuring instrument (instrument name: SurfRiDY-kit, produced by JFE Techno-Research Corporation) similarly to Example 1 before the mirror polishing. Note that the size of each sample was 50×100 mm. Based on the inclination angle distributions, that in an arbitrary range of 1,800 to 5,000 mm² in the sample surface was converted into curvature distribution by a similar method to that in Example 1 before the mirror polishing, and a standard deviation, a maximum, a minimum, and an absolute value obtained by differentiating the minimum and the maximum, of the curvature distribution, and a curvature distribution diagram were determined. Image clarity evaluations of Examples 1, 2, 3, 4, 6, and 8 and Comparative Example 1 after the mirror polishing measured are set forth in Table 2. In addition, the curvature distribution diagrams are depicted in FIG. 9.

Thereafter, the stainless steel layer on the outer side was mirror polished, and an electronic apparatus housing decorated in silver color by physical vapor deposition (PVD) decoration was produced.

<Waviness of Electronic Apparatus Housing>

For each of the flat surface sections (50×100 mm) of the back surfaces of the electronic apparatus housings obtained

TABLE 2

| | Waviness after mirror polishing First metal layer side (SUS) | | Evaluation of external appearance after mirror polishing | Roughness after mirror polishing First metal layer side (SUS) | | Evaluation results of image clarity of first metal layer (SUS) after mirror polishing Statistic of curvature distribution (μrad/mm) | | | |
|---|---|---|---|---|---|---|---|---|---|
| | Wa1 | Wz1 | | Ra | Rz | Standard deviation | Maximum | Minimum | \|Maximum − Minimum\| |
| Example 1 | 0.093 | 0.391 | Excellent | 12.9 | 64.9 | 41.9 | 181.8 | −188.7 | 370.5 |
| Example 2 | 0.242 | 0.938 | Excellent | 7.6 | 37.7 | 136.5 | 562.9 | −479.8 | 1042.7 |
| Example 3 | 0.213 | 0.946 | Good | 7.8 | 41 | 132.2 | 411.5 | −530.7 | 942.2 |
| Example 4 | 0.248 | 1.2 | Good | 10.7 | 50.8 | 131.9 | 559.2 | −501.5 | 1060.7 |
| Example 5 | — | — | Good | — | — | — | — | — | — |
| Example 6 | 0.704 | 3.409 | Fair | 17.2 | 117.7 | 357.9 | 1452.3 | −841 | 2293.3 |
| Example 7 | — | — | Good | — | — | — | — | — | — |
| Example 8 | 0.248 | 1.028 | Good | 8 | 43.7 | 97.8 | 469.8 | −289.2 | 759 |
| Comparative Example 1 | 1.577 | 6.55 | Poor | 8 | 37.7 | 529.9 | 1239.4 | −2286.5 | 3525.9 |

As indicated in Table 2 and FIG. 9, the roll-bonded bodies of the present embodiment had little waviness even after the mirror polishing, and exhibited excellent image clarity. This means little distortion of the surface of the roll-bonded body and indicates excellent external appearance property.

On the other hand, the roll-bonded body of Comparative Example 1 had a value of an absolute value (|maximum−minimum|) of the maximum and the minimum of the curvature distribution of 3,000 (grad/mm) or more, as set forth in Table 2, in image clarity evaluation after mirror polishing, which means that a problem as to external appearance property was left.

Note that the above-described embodiment and Examples may be variously modified in such ranges as not to depart from the gist of the present invention.

Example 9

Followingly, Examples in which the roll-bonded body of the present embodiment was used and processed into an electronic apparatus housing will be described specifically, but the present invention is not limited to these Examples.

Using the roll-bonded body obtained in Example 2, deep drawing with a longitudinal size of 150 mm, a transverse size of 75 mm, and a depth of 10 mm was conducted such that the stainless steel layer was disposed on the outer side, and the aluminum alloy layer was disposed on the inner side. Next, the stainless steel layer on the outer side was mirror polished, to produce an electronic apparatus housing.

Example 10

Using the roll-bonded body obtained in Example 2, deep drawing with a longitudinal size of 150 mm, a transverse size of 75 mm, and a depth of 10 mm was conducted such that the stainless steel layer is disposed on the outer side, and the aluminum alloy layer is disposed on the inner side.

Figure 11:
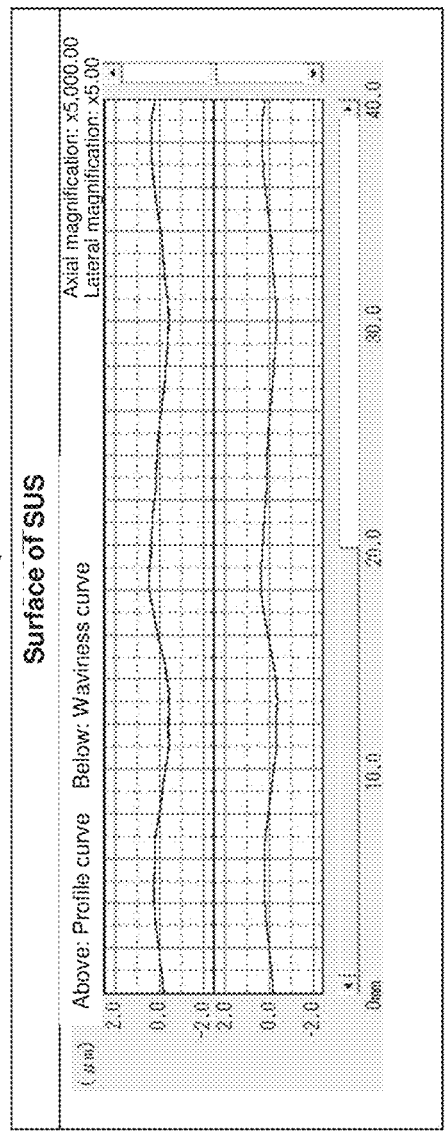
FIG. 11 is a diagram depicting waviness curves according to Example 9 and Example 10.
Figure 11:
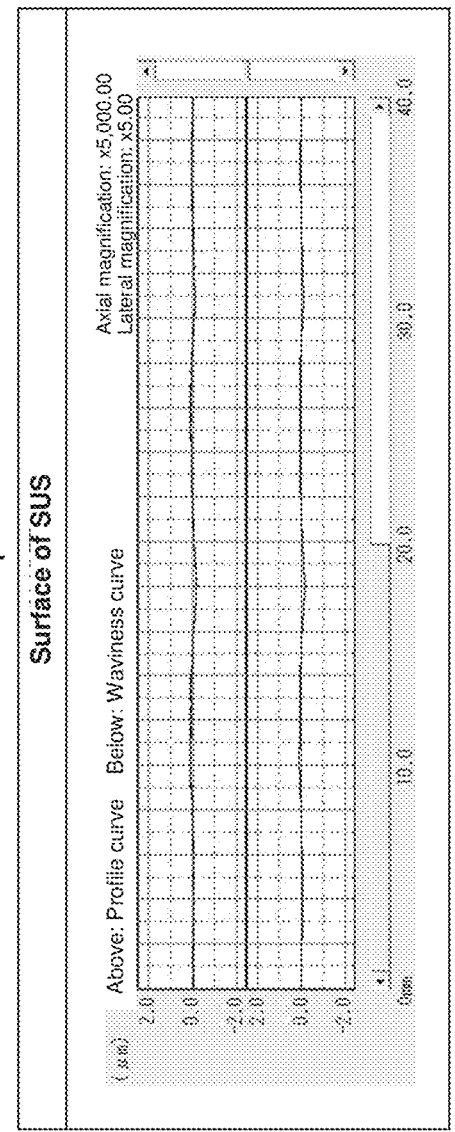

Next, for the purpose of securing a mounting space inside the electronic apparatus housing, the aluminum alloy layer on the inner side was ground, after which the inside shape of the housing was resin molded by a known technique.

in Examples 9 and 10, a profile curve and a waviness curve were obtained by the contact probe profilometer similarly to Example 1 before mirror polishing. These are depicted in FIG. 11. In addition, numerical values obtained therefrom are set forth in Table 3.

<Roughness of Electronic Apparatus Housing>

In addition, an arithmetic average roughness ($Ra_1$) and a maximum waviness height ($Rz_1$) of each of the flat surface sections in Examples 9 and 10 were determined by use of the contact probe profilometer similarly to Example 1 after mirror polishing. Besides, numerical values obtained therefrom are set forth in Table 3.

<Image Clarity of Electronic Apparatus Housing>

Further by using a surface distortion measuring instrument (instrument name: SurfRiDY-kit, produced by JFE Techno-Research Corporation) similarly to Example 1 before mirror polishing, inclination angle distribution in the longitudinal direction of the electronic apparatus housing was measured for each of the whole parts of the flat surface sections in Examples 9 and 10. Based on the inclination angle distribution obtained, that in an arbitrary range of 1,800 to 5,000 $mm^2$ in the flat surface section was converted into curvature distribution, and then a standard deviation, a maximum, a minimum, an absolute value obtained by differentiating the maximum and the minimum, of the curvature distribution, and a curvature distribution diagram were determined, by a similar method to that in Example 1 before mirror polishing. Note that the reason why the inclination angle distribution in the longitudinal direction was measured here lies in that the rolling direction of the roll-bonded body and the longitudinal direction of the electronic apparatus housing were identical. Therefore, it is desirable to carryout evaluation of image clarity, in accordance with the rolling direction at the time of processing the roll-bonded body into the electronic apparatus housing. In addition, numerical values obtained therefrom are set forth in Table 3. Besides, curvature distribution diagrams are depicted in FIG. 12.

TABLE 3

| | Waviness in flat surface section of electronic apparatus housing back surface | | Evaluation of external appearance of flat surface section of electronic apparatus housing back surface | Roughness of flat surface section of electronic apparatus housing back surface | | Evaluation results of image clarity of flat surface section of electronic apparatus housing back surface | | | |
|---|---|---|---|---|---|---|---|---|---|
| | First metal layer side | | | First metal layer side | | Statistic of curvature distribution (μrad/mm) | | | |
| | | | | | | Standard | | | \|Maximum − |
| | Wa1 | Wz1 | | Ra | Rz | deviation | Maximum | Minimum | Minimum\| |
| Example 9 | 0.208 | 0.854 | Excellent | 8.2 | 41.8 | 109.7 | 1245 | −305.4 | 1550.4 |
| Example 10 | 0.213 | 0.985 | Excellent | 6 | 35 | 149.3 | 587.1 | −760.3 | 1347.4 |

Figure 12:
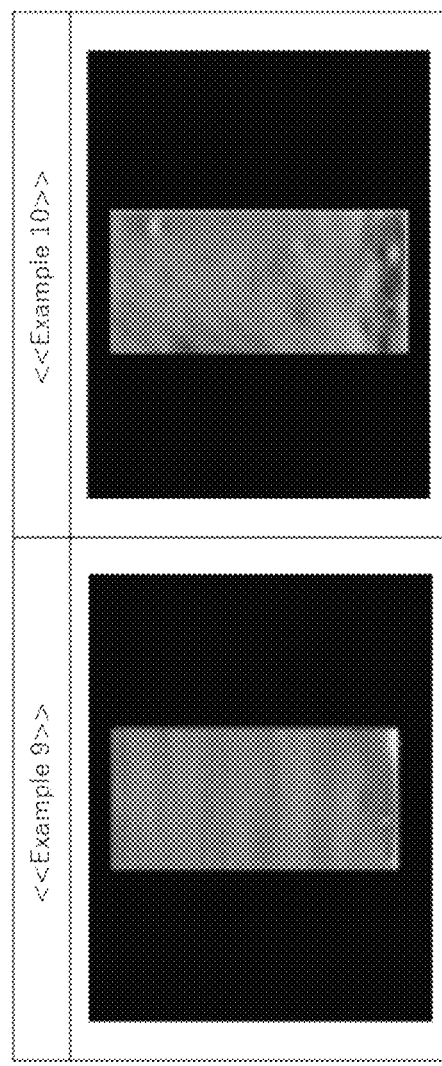
FIG. 12 is a diagram depicting curvature distributions according to Example 9 and Example 10.

As indicated in Table 3 and FIGS. 11 and 12, the electronic apparatus housings of the present embodiment had little waviness, and exhibited excellent image clarity. This means little distortion of the surface of the roll-bonded body, and indicates excellent external appearance property.

Example 11

The present invention will be described specifically below by using Examples in a case where the kinds of the metals constituting the roll-bonded body are changed, but the present invention is not limited to these Examples.

A roll-bonded body (thickness: 0.88 mm) of a pure titanium plate and an aluminum alloy plate was prepared by the surface activation bonding method. First, a pure titanium plate (TP270) 0.2 mm in thickness was used as the metal plate to be the first metal layer 10, and an aluminum alloy plate (A5052) 0.8 mm in thickness was used as the second metal layer 20. A sputter etching treatment was applied to TP270 and A5052. The sputter etching for TP270 was conducted under the conditions of a plasma output of 700 W for 13 minutes at a pressure of 0.1 Pa, and the sputter etching for A5052 was performed under the conditions of a plasma output of 700 W for 13 minutes at a pressure of 0.1 Pa.

After the sputter etching treatment, TP270 and A5052 were bonded by roll pressure welding at a linear rolling load of a pressing force of 1.9 to 4.0 tf/cm with a rolling roll diameter of 130 to 180 mm at normal temperature, to obtain a roll-bonded body of TP270 and A5052. The roll-bonded body was subjected to batch annealing under the conditions of 300° C. for 1 hour.

In the roll-bonded body thus obtained, the thickness of the pure titanium layer was 0.18 mm, and the thickness of the aluminum alloy layer was 0.70 mm.

<Waviness of Roll-bonded Body Including Pure Titanium and Aluminum Alloy>

Figure 13:
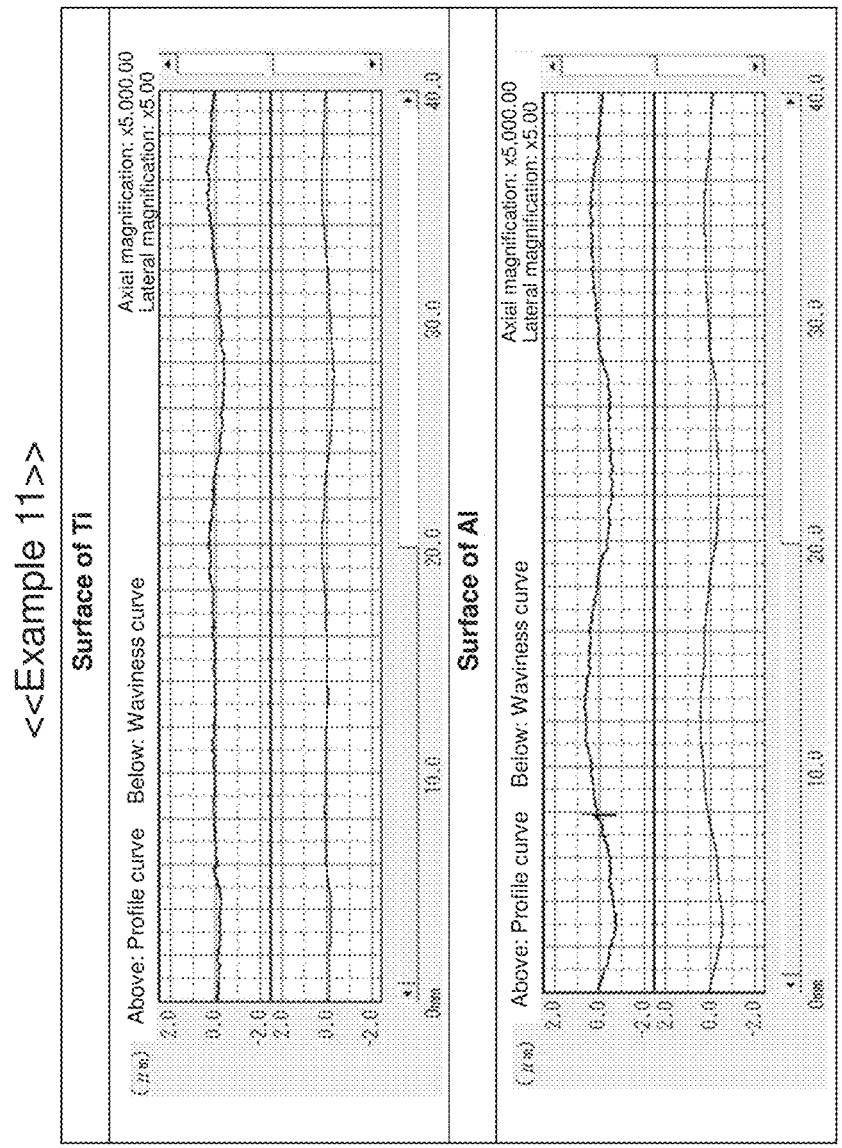
FIG. 13 is a diagram depicting a waviness curve according to Example 11.

The roll-bonded body obtained in Example 11 was cut out into a plate measuring 50×100 mm, of which a profile curve and a waviness curve were obtained by the contact probe profilometer similarly to Example 1 before mirror polishing. These are depicted in FIG. 13. Besides, numerical values obtained therefrom are set forth in Table 4.

TABLE 4

| | Waviness before mirror polishing | | | | Evaluation of external appearance before mirror polishing | Evaluation of external appearance after mirror polishing | Evaluation results of image clarity of first metal layer (Ti) before mirror polishing | | | |
|---|---|---|---|---|---|---|---|---|---|---|
| | Ti side | | AL side | | | | Statistic of curvature distribution (μrad/mm) | | | |
| | | | | | | | Standard | | | \|Maximum − |
| | Wa1[μm] | Wz1[μm] | Wa2[μm] | Wz2[μm] | | | deviation | Maximum | Minimum | Minimum\| |
| Example 11 | 0.170 | 0.511 | 0.291 | 1.468 | Excellent | Excellent | Unmeasured | Unmeasured | Unmeasured | Unmeasured |

Example 12

Followingly, the present invention will be described using Example in a case where the roll-bonded body has a three-layer configuration, but the present invention is not limited to the following.

A three-layer roll-bonded body (thickness: 0.3 mm) including stainless steel and pure aluminum plates was prepared by the surface activation bonding method. First, a pure aluminum plate (1N30) 0.05 mm in thickness was used as the metal plate to be the first metal layer 111, a stainless steel plate (SUS304) 0.2 mm in thickness was used as the intermediate metal layer 112, and a pure aluminum plate (1N30) 0.05 mm in thickness was used as the second metal layer 113.

A sputter etching treatment was applied to 1N30 to be the first metal layer and SUS304 to be the intermediate metal layer. The sputter etching for SUS304 was conducted under the conditions of a plasma output of 700 W for 13 minutes at a pressure of 0.1 Pa, and the sputter etching for 1N30 was performed under the conditions of a plasma output of 700 W for 13 minutes at a pressure of 0.1 Pa.

After the sputter etching, 1N30 and SUS304 were bonded to each other by roll pressure welding at a linear rolling load of a pressing force of 1.9 to 4.0 tf/cm with a rolling roll diameter of 130 to 180 mm at normal temperature, to obtain a two-layer roll-bonded body of 1N30 and SUS304.

Next, a sputter etching treatment was applied to the SUS304 surface of the roll-bonded body of the two-layer configuration and the surface to be bonded of 1N30 to be the second metal layer. The sputter etching for SUS304 of the roll-bonded body of the two-layer configuration was conducted under the conditions of a plasma output of 700 W for 13 minutes at a pressure of 0.1 Pa, and the sputter etching for 1N30 was performed under the conditions of a plasma output of 700 W for 13 minutes at a pressure of 0.1 Pa.

After the sputter etching treatment, the SUS304 surface of the roll-bonded body of the two-layer configuration and the 1N30 surface to be the second metal layer were laid on each other, and were bonded to each other by roll pressure welding at a linear rolling load of a pressing force of 1.9 to 4.0 tf/cm with a rolling roll diameter of 130 to 180 mm at normal temperature, to obtain a roll-bonded body of a three-layer configuration in which the first metal layer is 1N30, the intermediate metal layer is SUS304, and the second metal layer is 1N30. The roll-bonded body was subjected to batch annealing under the conditions of 250° C. for 1 hour.

In the roll-bonded body thus obtained, the thickness of the first metal layer 1N30 was 0.05 mm, the thickness of the intermediate metal layer SUS304 was 0.2 mm, and the thickness of the second metal layer 1N30 was 0.05 mm.

<Waviness of Roll-bonded Body of Three-Layer Configuration>

Figure 14:
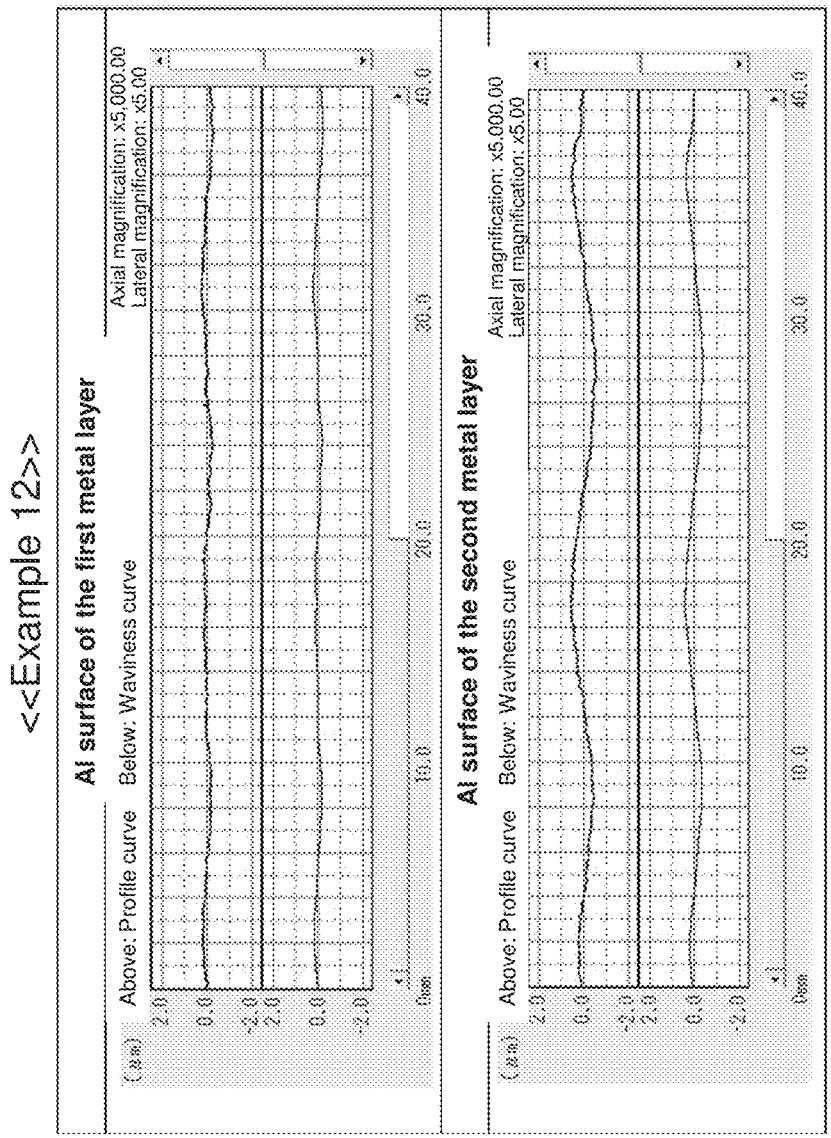
FIG. 14 is a diagram depicting a waviness curve according to Example 12.

The roll-bonded body of the three-layer configuration obtained in Example 12 was cut out into a plate measuring 50×100 mm, and, for each of the first metal layer 1N30 and the second metal layer 1N30, a profile curve and a waviness curve were obtained by the contact probe profilometer similarly to Example 1 before mirror polishing. These are depicted in FIG. 14. In addition, numerical values obtained therefrom are set forth in Table 5.

110: Roll-bonded body
111: First metal layer
112: Intermediate metal layer
113: Second metal layer
71: TV camera
72: Projector
73: Sample
74: Screen
8: Electronic apparatus housing
80: Electronic apparatus housing back surface
81: Electronic apparatus housing side surface
A: Flat surface section of electronic apparatus housing back surface

The invention claimed is:

1. A roll-bonded body obtained by bonding a first metal layer and a second metal layer to each other by rolling, wherein a surface of the first metal layer has an arithmetic average waviness ($Wa_1$) of 0.01 to 0.96 μm and a maximum waviness height ($Wz_1$) of 0.2 to 5.0 μm,
  wherein the arithmetic average waviness ($Wa_1$) and the maximum waviness height ($Wz_1$) is determined according to JIS B 0601:2001,
  wherein the first metal layer includes SUS, or Ni, Cu, or an alloy based on any one of these metals,
  wherein the second metal layer includes Al, or Mg, Cu, or an alloy based on any one of these metals.

TABLE 5

| | Waviness before mirror polishing | | | | Evaluation of external appearance before mirror polishing | Evaluation of external appearance after mirror polishing | Evaluation results of image clarity on Al (first metal layer) side before mirror polishing | | | |
|---|---|---|---|---|---|---|---|---|---|---|
| | Al (first metal layer) side | | Al (second metal layer) side | | | | Statistic of curvature distribution (μrad/mm) | | | |
| | | | | | | | Standard | | | \|Maximum − |
| | Wa1[μm] | Wz1[μm] | Wa2[μm] | Wz2[μm] | | | deviation | Maximum | Minimum | Minimum\| |
| Example 12 | 0.193 | 0.752 | 0.218 | 0.817 | Excellent | Excellent | Unmeasured | Unmeasured | Unmeasured | Unmeasured |

According to the above-described embodiment and Examples of the present invention, a roll-bonded body in which "waviness" in the surface on the outer surface side is suppressed can be provided, and the roll-bonded body is preferably applicable to a housing of an electronic apparatus having beautiful metallic luster and image clarity, for example.

Note that the above-described embodiment and each Example permit additional modifications and cutting and decoration in such ranges as not to depart from the gist of the present invention.

INDUSTRIAL APPLICABILITY

The roll-bonded body of the present invention, when used, for example, for a housing of a mobile electronic apparatus, exhibits excellent external appearance property and heat radiation property and the like, and is applicable to a wide field of industry in which an electronic apparatus is used.

REFERENCE SIGNS LIST

1: Roll-bonded body
2: Coil formed roll-bonded body
3: Coil formed roll-bonded body
10: First metal layer
20: Second metal layer 2. A roll-bonded body obtained by bonding a first metal layer and a second metal layer to each other by rolling, wherein a surface of the first metal layer opposite to a bonded surface with the second metal layer has an arithmetic average waviness ($Wa_1$) of 0.01 to 0.96 μm and a maximum waviness height ($Wz_1$) of 0.2 to 5.0 μm when the surface is mirror polished to an arithmetic average roughness ($Ra_1$) of 1 to 30 nm,
  wherein the arithmetic average waviness ($Wa_1$) and the maximum waviness height ($Wz_1$) is determined according to JIS B 0601:2001.

3. The roll-bonded body according to claim 1, wherein a surface of the second metal layer has an arithmetic average waviness ($Wa_2$) of 0.01 to 1.0 μm and a maximum waviness height ($Wz_2$) of 0.2 to 6.0 μm.

4. The roll-bonded body according to claim 1, wherein the arithmetic average waviness ($Wa_1$) of the surface of the first metal layer is smaller than the arithmetic average waviness ($Wa_2$) of a surface of the second metal layer.

5. The roll-bonded body according to claim 1, wherein the maximum waviness height ($Wz_1$) of the surface of the first metal layer is smaller than the maximum waviness height ($Wz_2$) of a surface of the second metal layer.

6. The roll-bonded body according to claim 1, wherein an intermediate metal layer is formed between the first metal layer and the second metal layer.

7. The roll-bonded body according to claim 1,
wherein the first metal layer is used on an outer surface side of an electronic apparatus housing, and
the second metal layer is used on an inner surface side of the electronic apparatus housing.

8. The roll-bonded body according to claim 6, wherein the intermediate metal layer includes Fe, Ti, Ni, Al, Mg, Cu, or an alloy based on any one of these metals.

9. An electronic apparatus housing which includes the roll-bonded body according to claim 1,
wherein the first metal layer is on an outer surface side of the electronic apparatus housing,
the second metal layer is on an inner surface side of the electronic apparatus housing.

10. The electronic apparatus housing according to claim 9, wherein an outer surface of the outer surface side has an arithmetic average roughness (Ra) of equal to or less than 30 nm.

11. A method of producing a roll-bonded body by bonding a first metal layer and a second metal layer to each other by rolling, the method comprising:

a step of correcting a shape of the roll-bonded body, and
a plate passing step after the shape correction,
wherein in the plate passing step, by setting an outside diameter of at least a roll on a finishing end side of the step to equal to or more than 200 mm, a roll-bonded body is obtained according to claim 1.

12. A method of producing a roll-bonded body by bonding a first metal layer and a second metal layer to each other by rolling, the method comprising:

a step of correcting a shape of the roll-bonded body, and
a plate passing step after the shape correction,
wherein in the plate passing step, a surface of the second metal layer of the roll-bonded body is first put into contact with a roll, to thereby obtain a roll-bonded body according to claim 1.

13. The roll-bonded body according to claim 2,
wherein the first metal layer includes SUS, or Ni, Cu, or an alloy based on any one of these metals,
wherein the second metal layer includes Al, or Mg, Cu, or an alloy based on any one of these metals.

\* \* \* \* \*